US011211384B2

United States Patent
Sills

(10) Patent No.: US 11,211,384 B2
(45) Date of Patent: Dec. 28, 2021

(54) MEMORY CELLS, ARRAYS OF TWO TRANSISTOR-ONE CAPACITOR MEMORY CELLS, METHODS OF FORMING AN ARRAY OF TWO TRANSISTOR-ONE CAPACITOR MEMORY CELLS, AND METHODS USED IN FABRICATING INTEGRATED CIRCUITRY

(71) Applicant: Micron Technology, Inc., Boise, ID (US)

(72) Inventor: Scott E. Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/852,870

(22) Filed: Dec. 22, 2017

(65) Prior Publication Data

US 2018/0197864 A1    Jul. 12, 2018

Related U.S. Application Data

(60) Provisional application No. 62/445,574, filed on Jan. 12, 2017.

(51) Int. Cl.
| | |
|---|---|
| *H01L 27/108* | (2006.01) |
| *H01L 49/02* | (2006.01) |
| *H01L 29/78* | (2006.01) |

(52) U.S. Cl.
CPC .. *H01L 27/10802* (2013.01); *H01L 27/10808* (2013.01); *H01L 27/10852* (2013.01); *H01L 28/91* (2013.01); *H01L 29/7827* (2013.01)

(58) Field of Classification Search
CPC ......... H01L 27/10802; H01L 27/10808; H01L 27/10852; H01L 28/91; H01L 29/7827
See application file for complete search history.

(56) References Cited

U.S. PATENT DOCUMENTS

| 4,103,342 A | 7/1978 | Miersch et al. |
| 4,554,570 A | 11/1985 | Jastrzebski |
| (Continued) | | |

FOREIGN PATENT DOCUMENTS

| EP | 0706187 | 4/1996 |
| EP | 2296176 | 3/2011 |
| (Continued) | | |

OTHER PUBLICATIONS

Chun et al.; "A 3T Gain Cell Embedded DRAM Utilizing Preferential Boosting For High Density and Low Power On-Die Caches"; IEEE Journal of Solid-State Circuits; vol. 46, No. 6, Jun. 2011; pp. 1495-1505.

(Continued)

*Primary Examiner* — Peter Bradford
(74) *Attorney, Agent, or Firm* — Wells St. John P.S.

(57) ABSTRACT

A two transistor-one capacitor memory cell comprises first and second transistors laterally displaced relative one another. A capacitor is above the first and second transistors. The capacitor comprises a conductive first capacitor node directly above and electrically coupled to a first node of the first transistor. A conductive second capacitor node is directly above the first and second transistors and is electrically coupled to a first node of the second transistor. A capacitor insulator is between the first and second capacitor nodes. The second capacitor node comprises an elevationally-extending conductive pillar directly above the first node of the second transistor. The conductive pillar has an elevationally outer portion that is of four-sided diamond shape in horizontal cross-section. Other memory cells, including arrays of memory cells are disclosed as are methods.

20 Claims, 18 Drawing Sheets

(56) References Cited

U.S. PATENT DOCUMENTS

| | | |
|---|---|---|
| 5,066,607 A | 11/1991 | Banerjee |
| 5,146,300 A | 9/1992 | Hammamoto et al. |
| 5,299,155 A | 3/1994 | Yanagi |
| 5,389,810 A | 2/1995 | Agata |
| 5,398,200 A | 3/1995 | Mazure et al. |
| 5,571,743 A | 11/1996 | Henkels et al. |
| 5,586,078 A | 12/1996 | Takase et al. |
| 5,646,900 A | 7/1997 | Tsukude et al. |
| 5,830,791 A | 11/1998 | Lee et al. |
| 5,898,608 A | 4/1999 | Hirano et al. |
| 6,028,806 A | 2/2000 | Waller |
| 6,141,286 A | 10/2000 | Vo et al. |
| 6,154,387 A | 11/2000 | Takata |
| 6,483,737 B2 | 11/2002 | Takeuchi et al. |
| 6,563,727 B1 | 5/2003 | Roth et al. |
| 6,710,465 B2 | 3/2004 | Song et al. |
| 6,720,609 B2 | 4/2004 | Deboer et al. |
| 6,744,087 B2 | 6/2004 | Misewich |
| 6,961,271 B2 | 11/2005 | Jeon et al. |
| 7,164,595 B1 | 1/2007 | Shore et al. |
| 7,330,388 B1 | 2/2008 | Chapman et al. |
| 7,378,702 B2 | 5/2008 | Lee |
| 7,408,218 B2 | 8/2008 | Akiyama et al. |
| 7,453,103 B2 | 11/2008 | Abbott et al. |
| 7,558,097 B2 | 7/2009 | Khellah et al. |
| 7,697,318 B2 | 4/2010 | Fukuda et al. |
| 8,018,058 B2 | 9/2011 | Lee |
| 8,212,311 B2 | 7/2012 | Masuoka et al. |
| 8,394,699 B2 | 3/2013 | Haller et al. |
| 8,866,208 B2 | 10/2014 | Lee |
| 9,184,218 B2 | 11/2015 | Zhang et al. |
| 9,245,893 B1* | 1/2016 | Sukekawa ......... H01L 27/10823 |
| 9,343,507 B2 | 5/2016 | Takaki |
| 9,378,780 B1 | 6/2016 | Chang et al. |
| 9,419,003 B1 | 8/2016 | Colinge et al. |
| 9,698,272 B1 | 7/2017 | Ikeda |
| 10,019,025 B2* | 7/2018 | Yamazaki ........... H01L 27/1255 |
| 10,020,311 B1 | 7/2018 | Li et al. |
| 10,079,235 B2 | 9/2018 | Mathew et al. |
| 10,096,603 B2 | 10/2018 | Kim et al. |
| 10,157,926 B2 | 12/2018 | Yang et al. |
| 10,319,724 B2 | 6/2019 | Mathew et al. |
| 10,355,002 B2 | 7/2019 | Sills |
| 10,381,357 B2 | 8/2019 | Karda et al. |
| 2001/0053088 A1 | 12/2001 | Forbes |
| 2002/0044477 A1 | 4/2002 | Takeuchi et al. |
| 2002/0093865 A1 | 7/2002 | Agata |
| 2002/0113260 A1 | 8/2002 | Yang et al. |
| 2002/0125508 A1* | 9/2002 | Durcan ................... H01L 28/65 257/239 |
| 2002/0140106 A1 | 10/2002 | Kurjanowicz |
| 2003/0087499 A1 | 5/2003 | Lane et al. |
| 2003/0169616 A1 | 9/2003 | Noro |
| 2003/0173593 A1 | 9/2003 | Miyatake |
| 2003/0185041 A1 | 10/2003 | Takahashi et al. |
| 2003/0202391 A1 | 10/2003 | Nishimura et al. |
| 2003/0234413 A1 | 12/2003 | Sberno et al. |
| 2004/0062101 A1 | 4/2004 | Kasuga |
| 2004/0090810 A1 | 5/2004 | Sakuma |
| 2004/0099886 A1 | 5/2004 | Rhodes et al. |
| 2004/0151020 A1 | 8/2004 | Beer |
| 2004/0174733 A1 | 9/2004 | Kirihata et al. |
| 2004/0232497 A1 | 11/2004 | Akiyama |
| 2004/0252542 A1 | 12/2004 | Hoya et al. |
| 2005/0023589 A1* | 2/2005 | Yamada ................... H01L 28/91 257/310 |
| 2006/0028859 A1 | 2/2006 | Forbes |
| 2006/0046391 A1 | 3/2006 | Tang et al. |
| 2006/0046424 A1 | 3/2006 | Chance et al. |
| 2006/0138466 A1 | 6/2006 | Choi |
| 2006/0164876 A1 | 7/2006 | Barth et al. |
| 2006/0211194 A1 | 9/2006 | Haller |
| 2007/0034928 A1 | 2/2007 | Cook et al. |
| 2007/0161179 A1 | 7/2007 | Lee |
| 2007/0235790 A1* | 10/2007 | Kim ....................... H01L 24/03 257/306 |
| 2007/0295995 A1 | 12/2007 | Yun |
| 2008/0079049 A1* | 4/2008 | Lee ....................... H01L 27/105 257/301 |
| 2008/0253170 A1 | 10/2008 | Inaba |
| 2009/0008691 A1 | 1/2009 | Lee et al. |
| 2009/0108881 A1 | 4/2009 | Wiison |
| 2009/0168489 A1 | 7/2009 | Madan et al. |
| 2009/0212338 A1 | 8/2009 | Benson |
| 2010/0112753 A1 | 5/2010 | Lee |
| 2010/0165704 A1 | 7/2010 | Wu et al. |
| 2010/0238697 A1 | 9/2010 | Juengling |
| 2010/0264484 A1 | 10/2010 | Masuoka et al. |
| 2010/0295110 A1 | 11/2010 | Takaishi |
| 2010/0297820 A1* | 11/2010 | Lee ....................... H01L 27/105 438/253 |
| 2011/0062523 A1 | 3/2011 | Masuoka et al. |
| 2012/0153371 A1 | 6/2012 | Chen et al. |
| 2013/0099305 A1 | 4/2013 | Kim et al. |
| 2013/0161607 A1 | 6/2013 | Yoneda |
| 2013/0214420 A1* | 8/2013 | Shimamoto ....... H01L 27/10823 257/773 |
| 2013/0221356 A1 | 8/2013 | Yamazaki |
| 2013/0235641 A1 | 9/2013 | Iwaki |
| 2013/0235642 A1 | 9/2013 | Heineck et al. |
| 2013/0286734 A1 | 10/2013 | Chang |
| 2014/0027839 A1 | 1/2014 | Kim |
| 2014/0035018 A1 | 2/2014 | Lee |
| 2014/0054718 A1 | 2/2014 | Kanda et al. |
| 2014/0097481 A1* | 4/2014 | La Rosa ............. G11C 16/0433 257/315 |
| 2014/0220749 A1 | 8/2014 | Rutter |
| 2015/0041885 A1 | 2/2015 | Yoshida et al. |
| 2015/0078056 A1 | 3/2015 | Liu |
| 2015/0102282 A1 | 4/2015 | Zhang et al. |
| 2015/0179655 A1 | 6/2015 | Nakanishi et al. |
| 2015/0318285 A1 | 11/2015 | Zhang |
| 2016/0071843 A1 | 3/2016 | Kadoya |
| 2016/0079247 A1 | 3/2016 | Lim et al. |
| 2016/0181251 A1* | 6/2016 | Yoo ......................... H01L 28/90 365/149 |
| 2017/0033111 A1* | 2/2017 | Yamazaki ......... H01L 27/10873 |
| 2017/0053920 A1 | 2/2017 | Kim et al. |
| 2017/0186782 A1* | 6/2017 | Lee ....................... H01L 27/1225 |
| 2018/0061835 A1 | 3/2018 | Yang et al. |
| 2018/0061840 A1 | 3/2018 | Sills |
| 2018/0197864 A1 | 7/2018 | Sills |
| 2019/0019544 A1* | 1/2019 | Derner ................. G11C 11/2273 |

FOREIGN PATENT DOCUMENTS

| | | |
|---|---|---|
| JP | H 03-205867 | 9/1991 |
| JP | H 08-147986 | 6/1996 |
| JP | H 08-264764 | 10/1996 |
| JP | 2003-303901 | 10/2003 |
| JP | 2011-142256 | 7/2011 |
| KR | 10-2006-0126795 | 12/2006 |
| KR | 10-2007-0070021 | 7/2007 |
| KR | 10-2016-0032559 | 3/2016 |
| TW | 201025352 | 7/2010 |
| TW | I402915 | 7/2013 |
| TW | 107100862 | 8/2018 |
| WO | WO 2005/093836 | 10/2005 |
| WO | PCT/US2017/044611 | 11/2017 |
| WO | PCT/US2017/044633 | 11/2017 |
| WO | PCT/US2017/044638 | 11/2017 |
| WO | PCT/US2017/044653 | 11/2017 |
| WO | PCT/US2017/044661 | 11/2017 |
| WO | PCT/US2017/045052 | 11/2017 |

(56) References Cited

FOREIGN PATENT DOCUMENTS

WO PCT/US2017/068227 4/2018
WO PCT/US2017/068227 7/2019

OTHER PUBLICATIONS

Henkels et al.; "Large-Signal 2T, 1C DRAM Cell: Signal and Layout Analysis"; IEEE Journal of Solid-State Circuits; vol. 29, No. 7; Jul. 1994; pp. 829-832.
Wei et al., "A New High-Reliable 2T/1C FeRAM Cell", Integrated Ferroelectrics vol. 81, 2006, Switzerland, pp. 149-155.

* cited by examiner

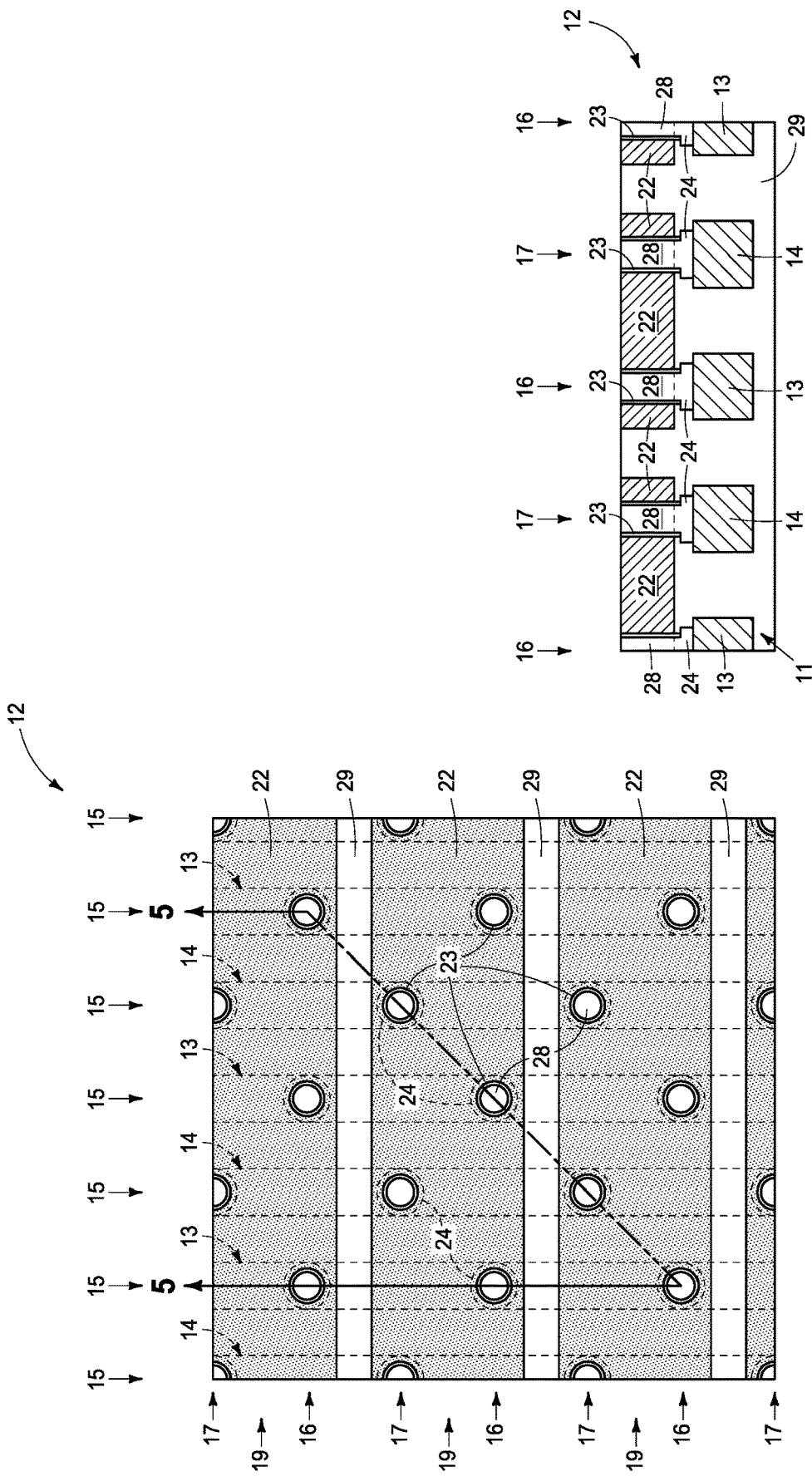

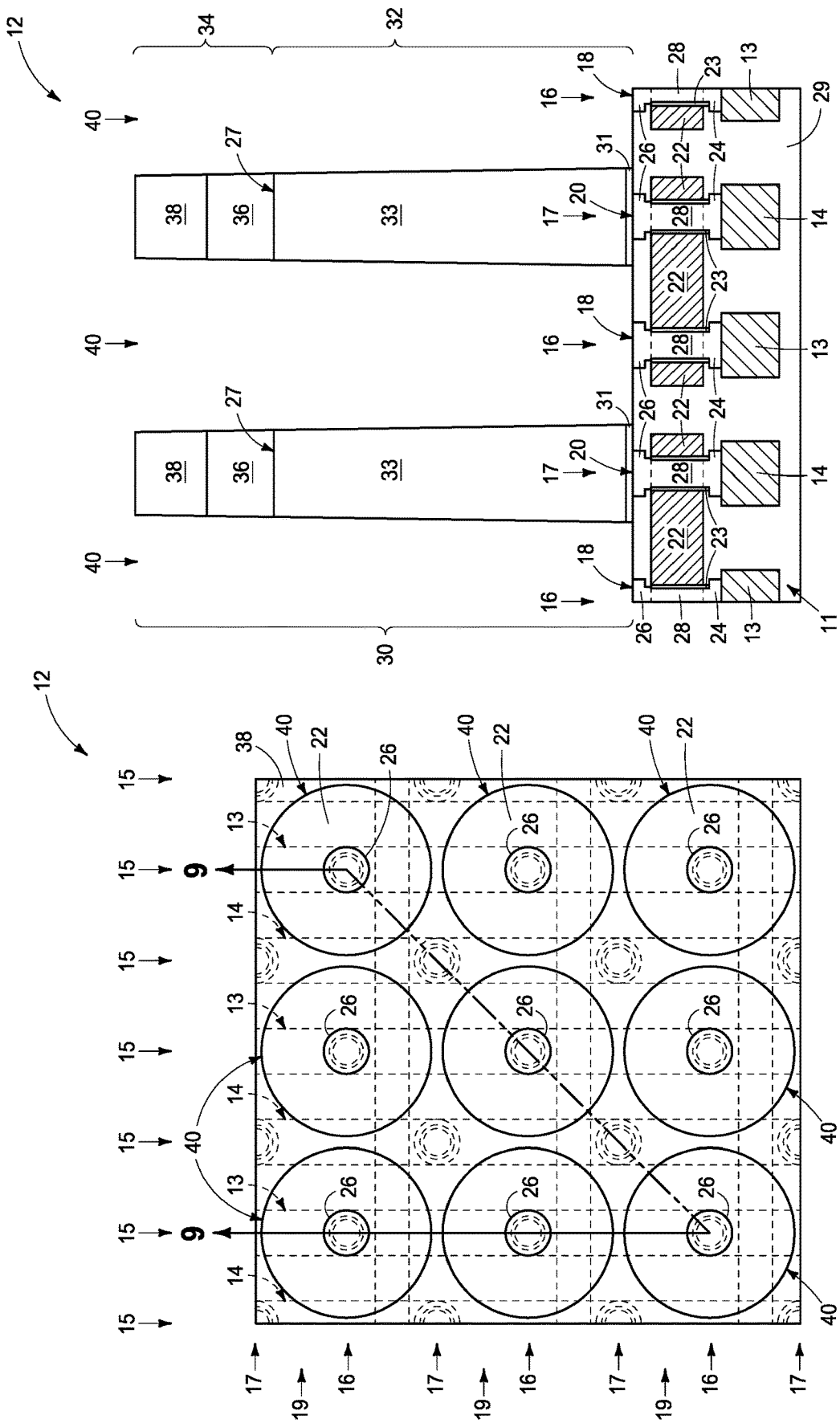

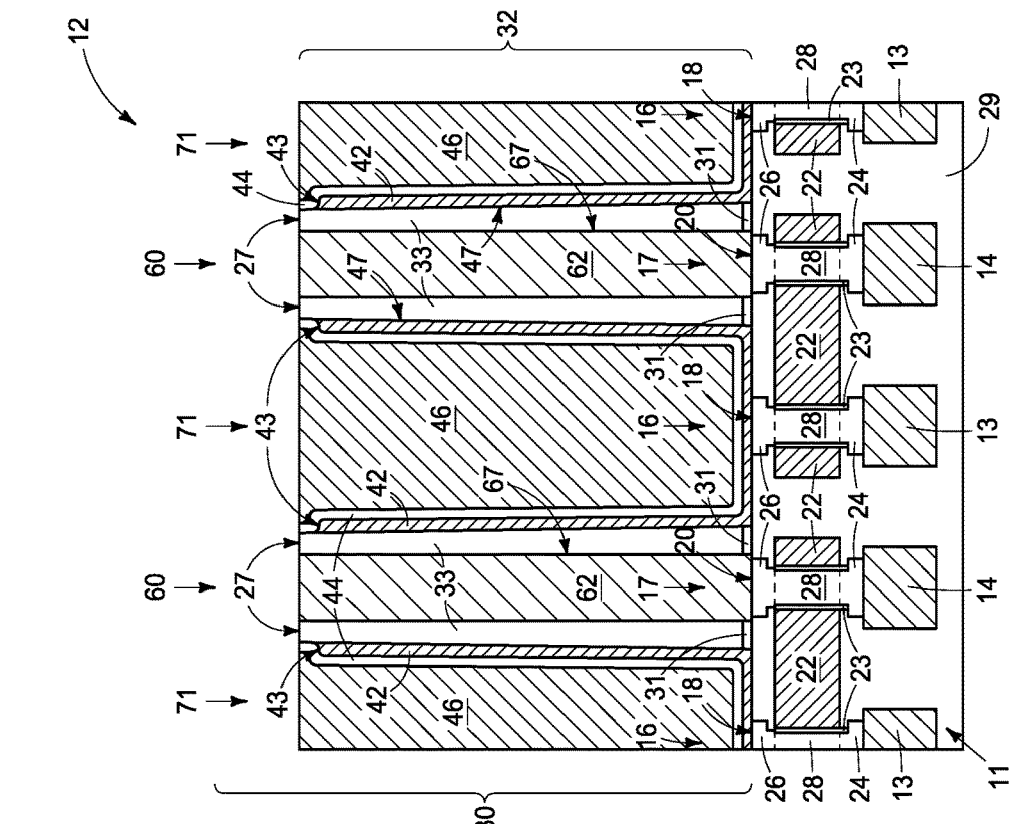
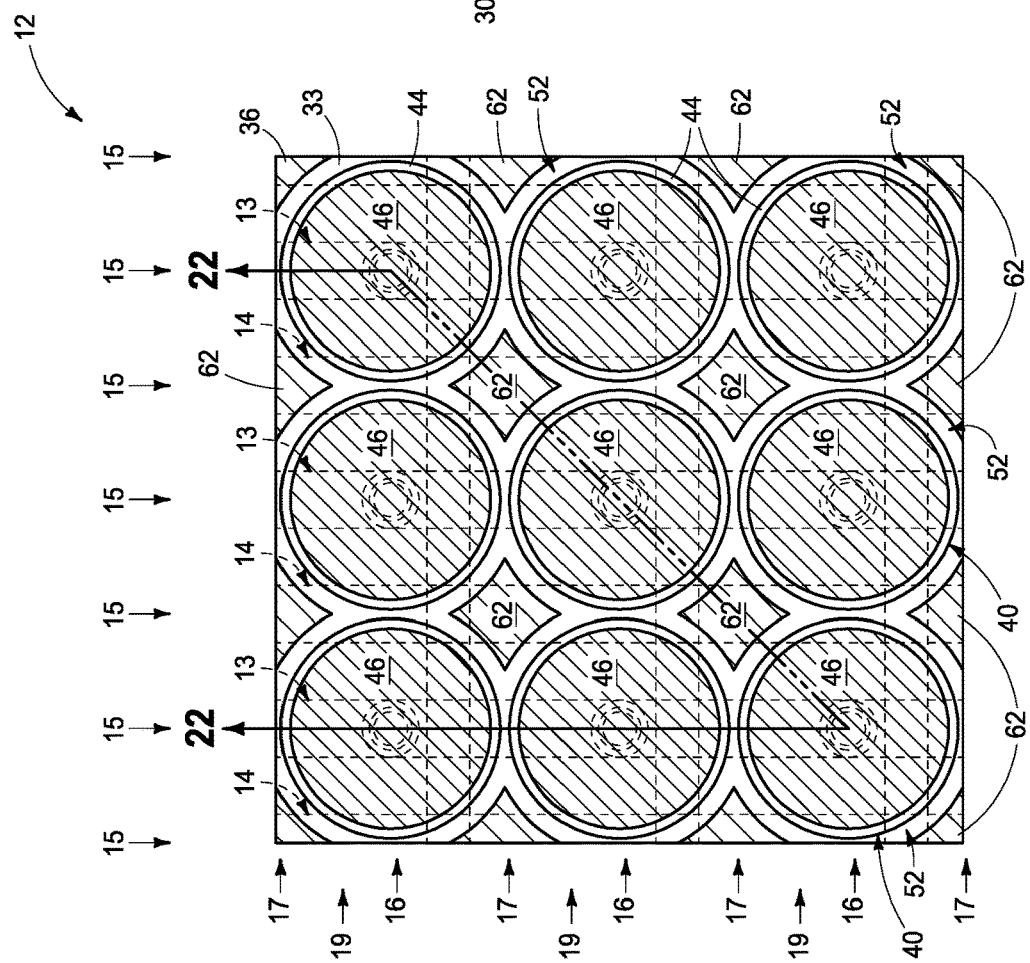

US 11,211,384 B2

MEMORY CELLS, ARRAYS OF TWO TRANSISTOR-ONE CAPACITOR MEMORY CELLS, METHODS OF FORMING AN ARRAY OF TWO TRANSISTOR-ONE CAPACITOR MEMORY CELLS, AND METHODS USED IN FABRICATING INTEGRATED CIRCUITRY

RELATED PATENT DATA

This patent claims priority to U.S. Provisional Patent Application Ser. No. 62/445,574, which was filed Jan. 12, 2017.

TECHNICAL FIELD

Embodiments disclosed herein pertain to memory cells, to methods of forming memory cells, and to methods used in fabricating integrated circuitry.

BACKGROUND

Dynamic Random Access Memory (DRAM) is used in modern computing architectures. DRAM may provide advantages of structural simplicity, low cost, and speed in comparison to other types of memory.

Presently, DRAM commonly has individual memory cells that have one capacitor in combination with a field effect transistor (so-called 1T-1C memory cells), with the capacitor being coupled with one of the source/drain regions of the transistor. One of the limitations to scalability of present 1T-1C configurations is that it is difficult to incorporate capacitors having sufficiently high capacitance into highly-integrated architectures. Accordingly, it would be desirable to develop new memory cell configurations suitable for incorporation into highly-integrated modern memory architectures.

While the invention was motivated by architecture and method associated with other than 1T-1C memory cells, some aspects of the invention are in no way so limited and may have applicability to any memory cell and to methods used in fabricating any integrated circuitry.

BRIEF DESCRIPTION OF THE DRAWINGS

FIG. 4 is a view of the FIG. 2 construction at a processing step subsequent to that shown by FIG. 2.

FIG. 5 is a cross-sectional view taken through line 5-5 in FIG. 4.

FIG. 8 is a view of the FIG. 6 construction at a processing step subsequent to that shown by FIG. 6.

FIG. 9 is a cross-sectional view taken through line 9-9 in FIG. 8.

FIG. 21 is a top plan view of the FIG. 20 construction at a processing step subsequent to that shown by FIG. 20.

FIG. 22 is a cross-sectional view taken through line 22-22 in FIG. 21.

DETAILED DESCRIPTION OF EXAMPLE EMBODIMENTS

Figure 1:
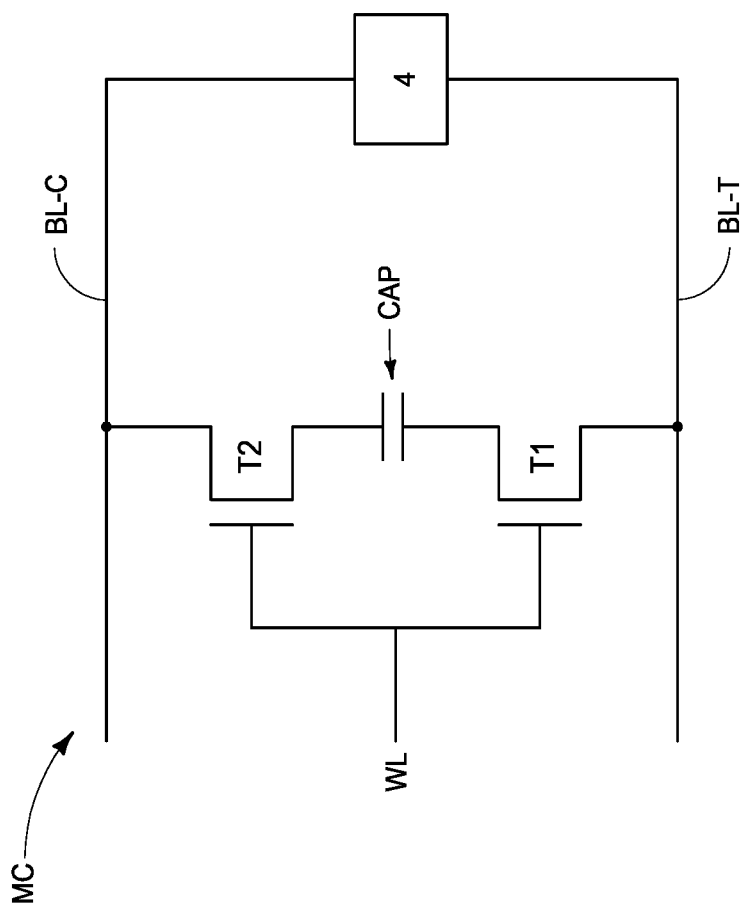
FIG. 1 is a non-structural diagrammatic schematic showing a 2T-1C memory cell.

Embodiments of the invention include a memory cell and an array of memory cells independent of methods of manufacture. Embodiments of the invention also include methods of forming an array of two transistor-one capacitor (2T-1C) memory cells, and methods used in fabricating integrated circuitry. Although not everywhere so-limited, drawings are provided which depict method of fabrication and structure associated with a 2T-1C memory cell, for example as schematically shown in FIG. 1. An example 2T-1C memory cell MC has two transistors T1 and T2 and a capacitor CAP. A source/drain region of T1 connects with a first node of capacitor CAP and the other source/drain region of T1 connects with a first comparative bit line (e.g., BL-T). A gate of T1 connects with a word line WL. A source/drain region of T2 connects with a second node of capacitor CAP, and the other source/drain region of T2 connects with a second comparative bit line (e.g., BL-C). A gate of T2 connects with word line WL. Comparative bit lines BL-T and BL-C extend to circuitry 4 which compares electrical properties (e.g., voltage) of the two to ascertain a memory state of memory cell MC. The 2T-1C configuration of FIG. 1 may be used in DRAM and/or other types of memory.

Figure 3:
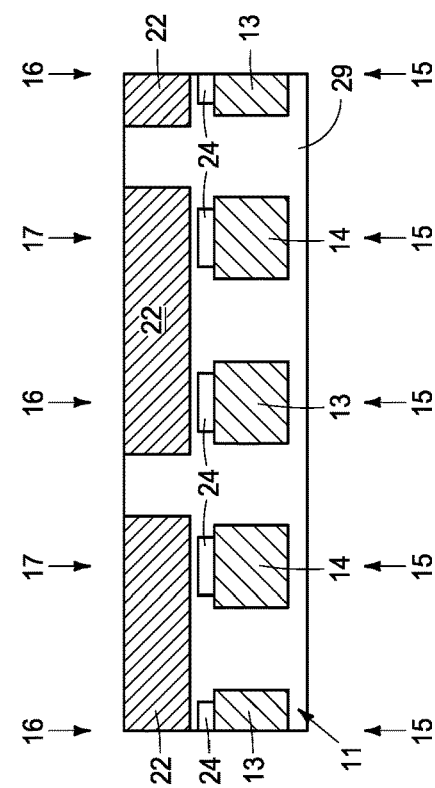
FIG. 3 is a cross-sectional view taken through line 3-3 in FIG. 2.
Figure 2:
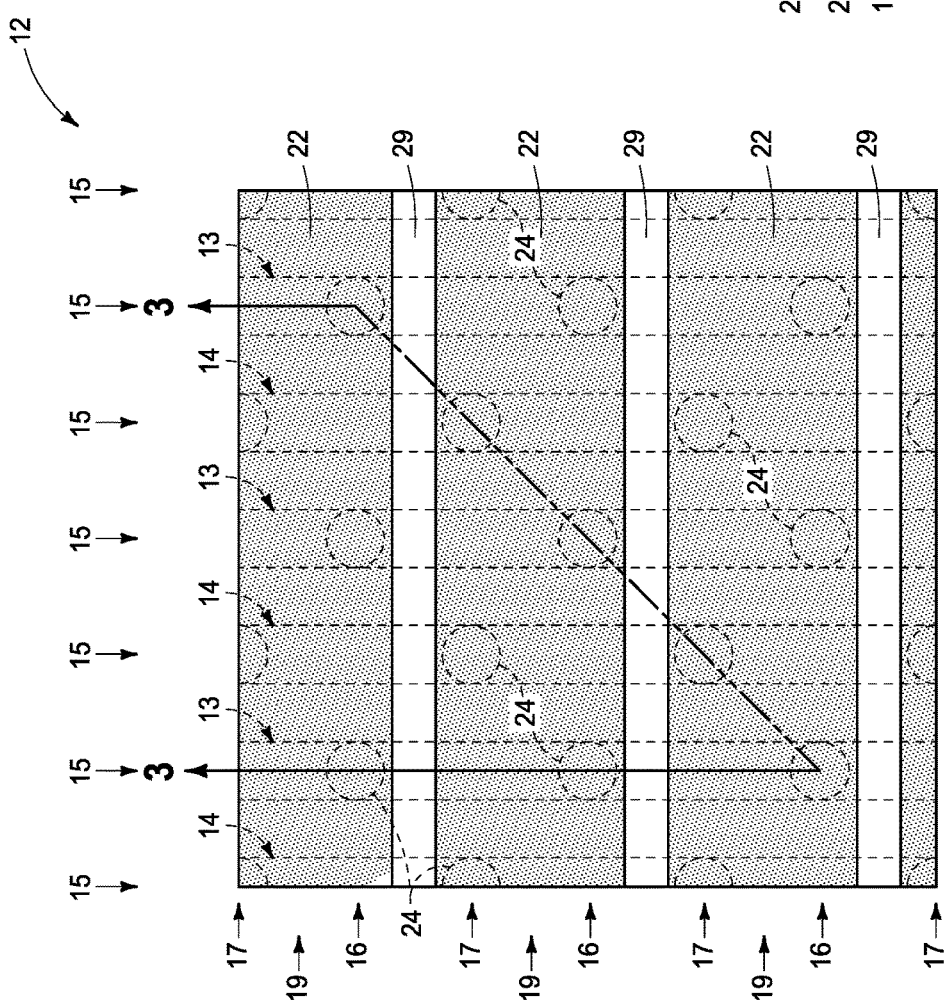
FIG. 2 is a diagrammatic top plan view of a construction comprising an array of 2T-1C memory cells in fabrication in accordance with an embodiment of the invention.

Example embodiments of methods of forming an array of 2T-1C memory cells MC are initially described with reference to FIGS. 2-24. Referring to FIGS. 2 and 3, such depict a portion of a substrate fragment of a construction 12 and within which multiple memory cells MC (not shown) will ultimately be fabricated. Materials may be aside, elevationally inward, or elevationally outward of the FIGS. 2 and 3—depicted materials. For example, other partially or wholly fabricated components of integrated circuitry may be provided somewhere about or within construction 12. Regardless, any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Construction 12 includes a base substrate 11 that may include any one or more of conductive/conductor/conducting (i.e., electrically herein), semiconductive, or insulative/insulator/insulating (i.e., electrically herein) materials. Construction 12 comprises columns 15 of digit lines 13, 14 (i.e., sometimes referred to in the industry as bit lines, data lines, or sense lines), and which in some embodiments may be referred to as first digit lines 13 and second digit lines 14. Construction 12 also comprises rows 19 of access lines 22 which are associated with rows 16 and rows 17 of first and second, respectively, elevationally-extending field effect transistors being fabricated. Access lines 22 are above digit lines 13, 14, and are shown with stippling in FIG. 2 (and FIG. 4) for better clarity therein of underlying features. Example conductive materials for the access lines and the digit lines, and for any conductive material herein, include one or more of elemental metal, a mixture or alloy of two or more elemental metals, conductive metal compounds, and conductively-doped semiconductive materials.

In this document, unless otherwise indicated, "elevational(ly)", "higher", "upper", "lower", "top", "atop", "bottom", "above", "below", "under", "beneath", "up", and "down" are generally with reference to the vertical direction. Further, "vertical" and "horizontal" as used herein are directions that are perpendicular or within 10 degrees of perpendicular relative one another independent of orientation of the substrate in three-dimensional space. "Horizontal" refers to a general direction (i.e., within 10 degrees) along a primary substrate surface and may be relative to which the substrate is processed during fabrication. Also, "extend(ing) elevationally" and "elevationally-extending" in this document encompasses a range from vertical to no more than 45° from vertical. Further, "extend(ing) elevationally", "elevationally-extending", and "vertical(ly)" with respect to a field effect transistor are with reference to orientation of the transistor's channel length along which current flows in operation between two source/drain regions of the transistor that are at two different elevations. Also, use of "row" and "column" in this document is for convenience in distinguishing one series or orientation of features (e.g., lines and transistors) from another series or orientation of features and along which components have been or will be formed. The rows may be straight and/or curved and/or parallel and/or not parallel relative one another, as may be the columns. Further, the rows and columns may intersect relative one another at 90° or at one or more other angles. Further, reference to "first" and "second" with respect to different components or materials herein is only for convenience of description in referring to different components, different materials, and/or same materials or components formed at different times. Accordingly, and unless otherwise indicated, "first" and "second" may be interchanged independent of relative position within the finished circuit construction and independent of sequence in fabrication.

Nodes 24 (i.e., conductive, and e.g., through which current flows) of the first and second transistors in fabrication are electrically coupled (in one embodiment, directly electrically coupled) to an individual digit line 13, 14. In one embodiment, nodes 24 are above (in one embodiment, directly above) an individual digit line 13 or 14. In this document, regions/materials/components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions/materials/components. In contrast, when regions/materials/components are referred to as being "directly electrically coupled", no intervening electronic component (e.g., no diode, transistor, resistor, transducer, switch, fuse, etc.) is between the directly electrically coupled regions/materials/components. Further, "directly above" requires at least some lateral overlap (i.e., horizontally) of two stated regions/materials/components relative one another. Further, use of "above" not preceded by "directly" only requires that some portion of the stated region/material/component that is above the other be elevationally outward of the other (i.e., independent of whether there is any lateral overlap of the two stated regions/materials/components). Nodes 24 in some embodiments may be referred to as second nodes 24 or as elevationally inner source/drain regions 24. An ideal example conductive material for nodes 24 is suitably conductively doped semiconductor material (e.g., polysilicon). Construction 12 is shown as comprising dielectric material 29 (e.g., silicon nitride and/or doped or undoped silicon dioxide) about components 13, 14, 24, and 22.

Referring to FIGS. 4 and 5, channel openings have been etched through access lines 22 to individual nodes 24. Such have then been lined with a suitable gate insulator 23 (e.g., silicon dioxide, silicon nitride, high-k dielectric, ferroelectric material, etc.). Such may be formed by depositing insulator 23 to cover atop access lines 22 and to line the channel openings, followed for example by being subjected to an anisotropic etch (e.g., a reactive ion spacer etch) to remove it from being centrally over bases of the openings. Some of insulator 23 may remain atop (not shown) access lines 22. This may be followed by filling remaining volume of the channel openings with channel material, followed by removing the channel material back at least to elevationally-outermost surfaces of access lines 22 and dielectric material 29, thus forming channels 28. The channel material, by way of example, may be variously suitably doped during deposition of semiconductive-capable material (e.g., polysilicon). For example, and in the example depicted embodiment, a lowest-most region of such material below access lines 22 may be suitably conductively doped so that such region along with material of nodes 24 function as a conductive source/drain region, with semiconductive channel material there-above being suitably doped to form channels 28.

Figure 7:
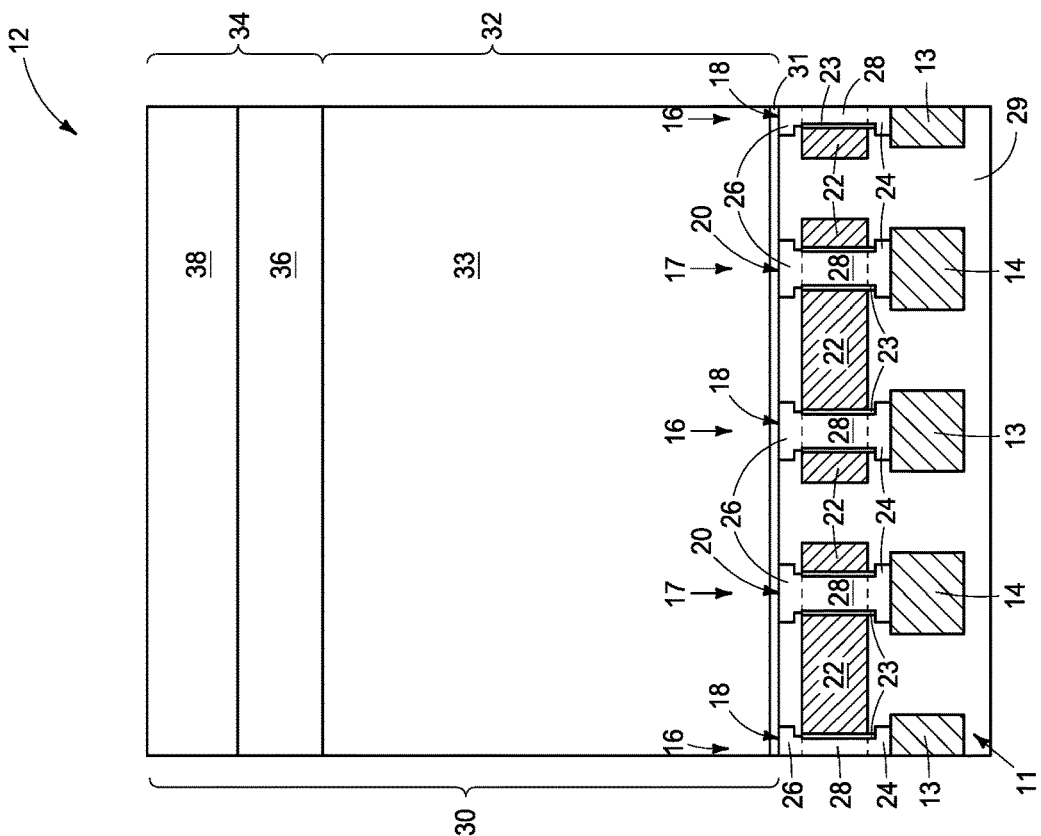
FIG. 7 is a cross-sectional view taken through line 7-7 in FIG. 6.
Figure 6:
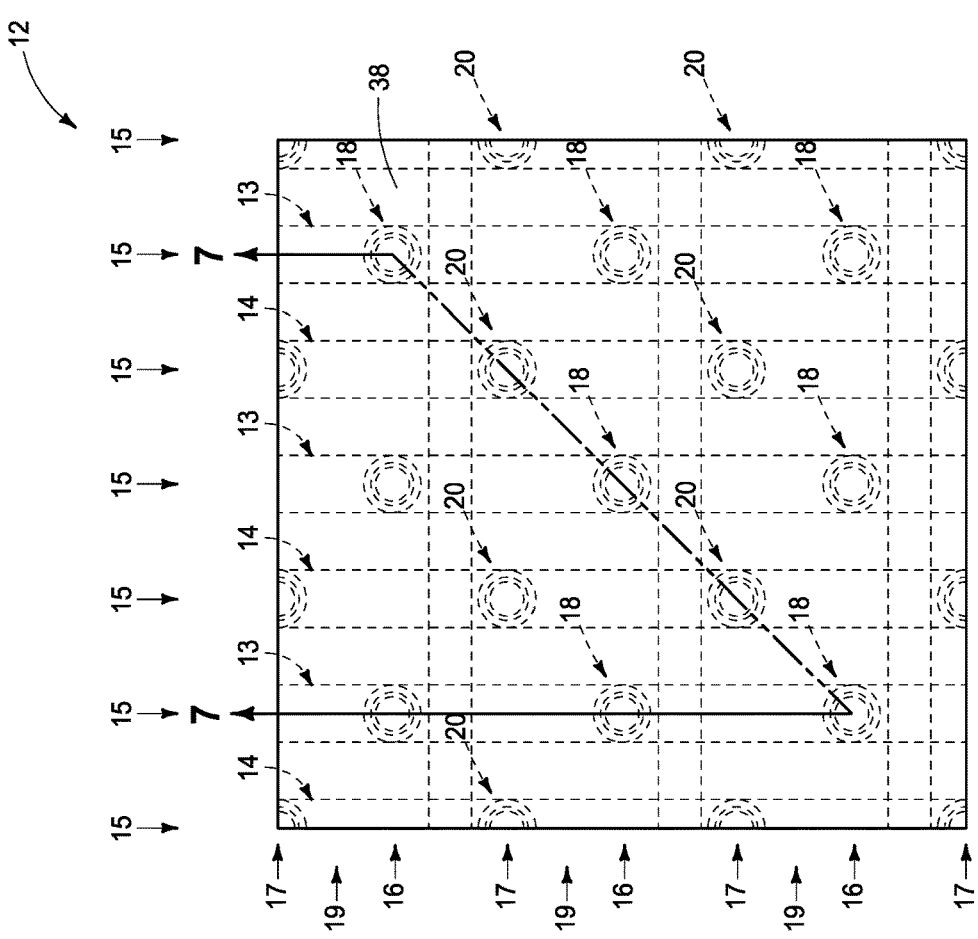
FIG. 6 is a view of the FIG. 4 construction at a processing step subsequent to that shown by FIG. 2.

Referring to FIGS. 6 and 7, and in one embodiment, nodes 26 have been formed directly electrically coupled to channels 28, thus forming first field effect transistors 18 and second field effect transistors 20 in rows 16 and 17, respectively. Nodes 26 in some embodiments may be referred to as first nodes 26 or as elevationally outer source/drain regions 26, and regardless may be of the same composition and/or construction as that of nodes 24. First and second transistors 18, 20 comprise a respective gate that may be considered as comprising part of an individual access line 22 and which are shown optionally encircling individual channels 28. Dielectric material has been provided/formed about nodes 26, is not separately numerically designated, and may be of the same or different composition as that of dielectric material 29 (same composition being shown). Regardless, and in embodiment as shown, channels 28 of the first and second transistors 18, 20 are inter-row staggered (e.g., staggered relative one another along rows 16 and 17).

Material 30 has been formed elevationally outward of transistors 18, 20. In one embodiment, such comprises an elevationally inner dielectric material 32 (e.g., silicon nitride 31 and doped or undoped silicon dioxide 33) and an elevationally outer material 34. In one embodiment and as shown, material 34 comprises an elevationally inner material 36 and an elevationally outer material 38 of different composition from that of material 36 (e.g., silicon nitride for material 36, carbon for material 38).

Referring to FIGS. 8 and 9, a plurality of openings 40 (in one embodiment capacitor openings) has been formed in material 30 and that individually extend to a first node 26 of individual first transistors 18. In one embodiment and as shown, openings 40 are aligned in immediately adjacent rows 16 (i.e., they are inter-row aligned). In one embodiment, the capacitors are arrayed in a 2D square Bravais lattice (as shown), and in one embodiment are arrayed in a 2D rectangular Bravais lattice (not shown in FIGS. 8 and 9). Example techniques for forming openings 40 include photolithographic patterning and etch, and may include pitch multiplication.

Figure 11:
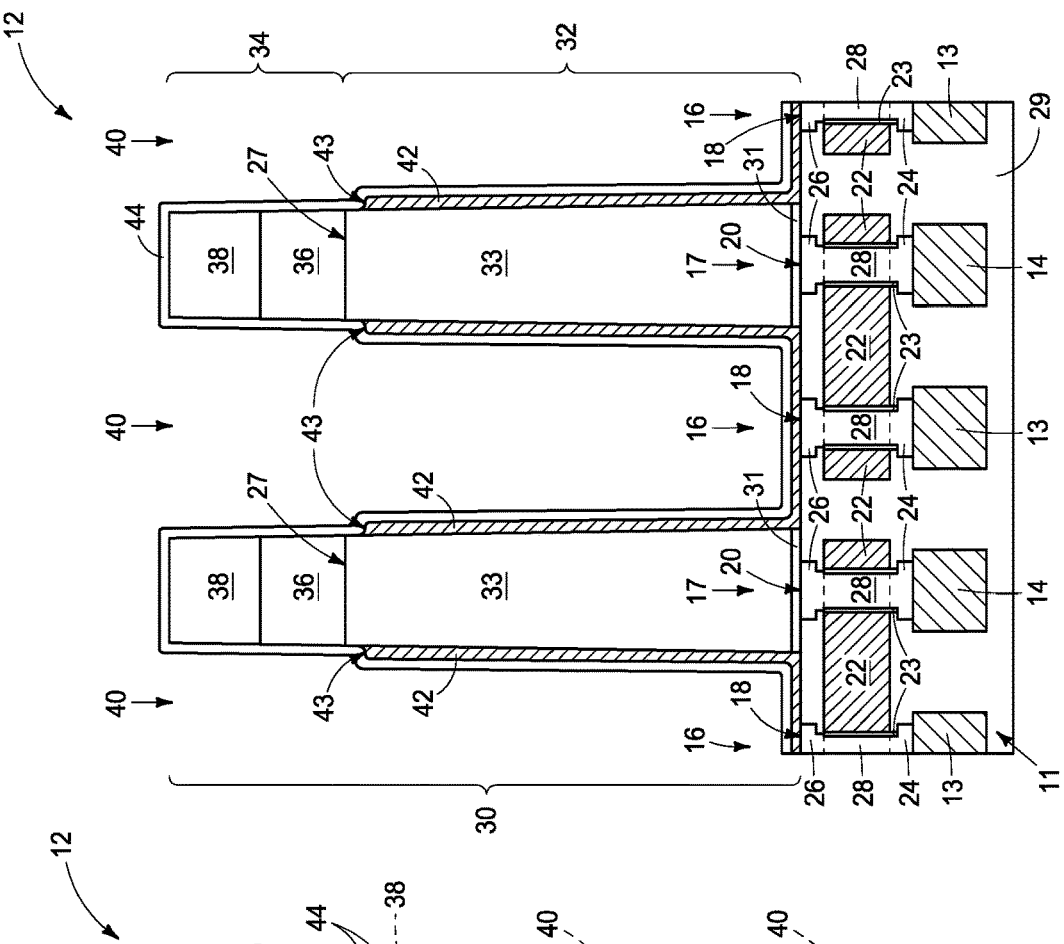
FIG. 11 is a cross-sectional view taken through line 11-11 in FIG. 10.
Figure 10:
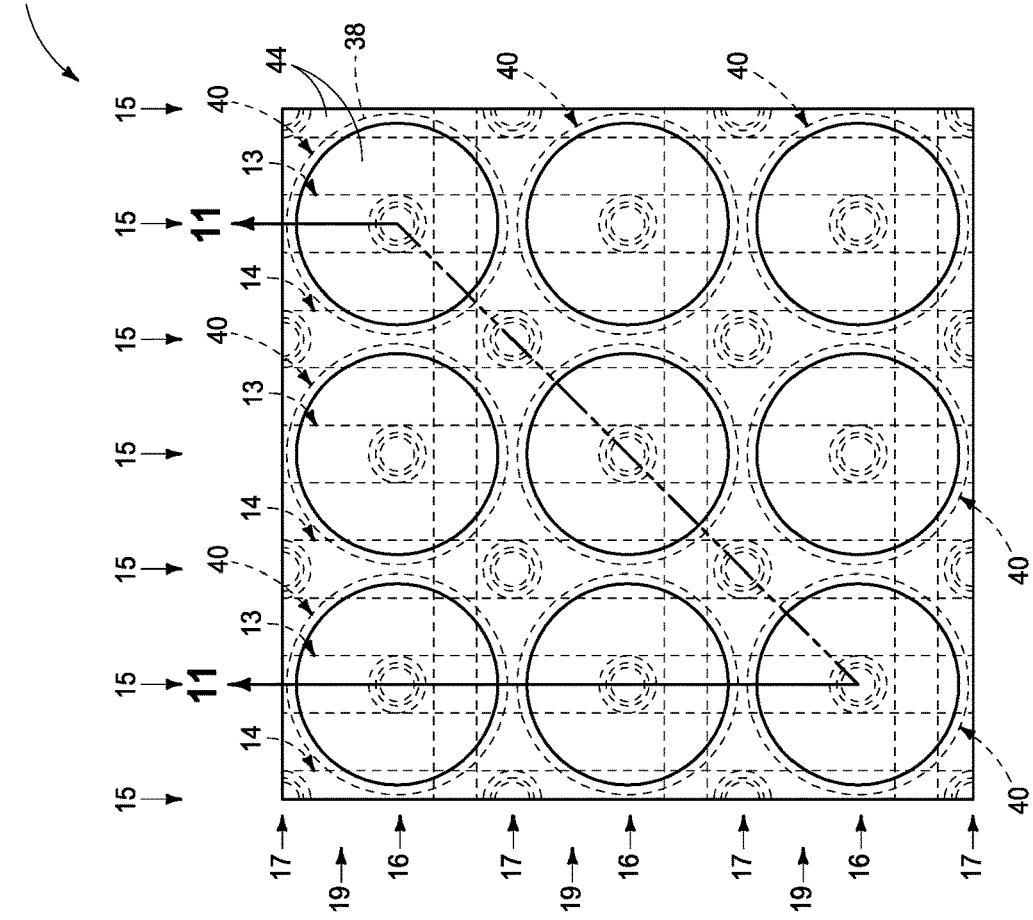
FIG. 10 is a view of the FIG. 8 construction at a processing step subsequent to that shown by FIG. 8.

Referring to FIGS. 10 and 11, a conductive material has been deposited to line and less-than-fill openings 40, and then in one embodiment etched back to have its tops 43 be below tops 27 of inner dielectric material 32, thus forming a first capacitor node 42 (i.e., conductive). In one embodiment and as shown, first capacitor node 42 is of a container shape. Regardless, in one embodiment and as shown, first capacitor node 42 is electrically coupled (in one embodiment directly electrically coupled) to first node 26 of individual first transistors 18, and in one embodiment is directly against an upper surface of first node 26. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another. In one embodiment and as shown, first capacitor node 42 is directly above first node 26 of first transistor 18, and in one embodiment container-shaped first capacitor node 42 and first transistor 18 are longitudinally coaxial (e.g., along a common vertical axis in the depicted embodiment). First capacitor node 42 may be of the same or different composition as that of one or both of access lines 22 and digit lines 13, 14. Example first capacitor node 42 may be formed by initial deposition of conductive material to a thickness considerably greater than shown, followed by isotropic or anisotropic etch-back to leave a base of node 42 over first nodes 26. Alternately, by way of example, the conductive material deposition may be to roughly its final thickness, followed by plugging the opening with sacrificial material, then etch-back, and then removal of the sacrificial material.

A capacitor insulator 44 has been deposited to line and less-than-fill remaining volume of openings 40. In one embodiment and as shown, capacitor insulator 44 extends across top 43 of container-shaped first capacitor node 42, and in one embodiment is directly against tops 43. Example materials for capacitor insulator 44 are non-ferroelectrics such as any one or more of silicon dioxide, silicon nitride, aluminum oxide, hafnium oxide, zirconium oxide, etc. Alternately, such may comprise ferroelectric material such as any one or more of a transition metal oxide, zirconium, zirconium oxide, hafnium, hafnium oxide, lead zirconium titanate, tantalum oxide, and barium strontium titanate; and having dopant therein which comprises one or more of silicon, aluminum, lanthanum, yttrium, erbium, calcium, magnesium, niobium, strontium, and a rare-earth element.

Figure 13:
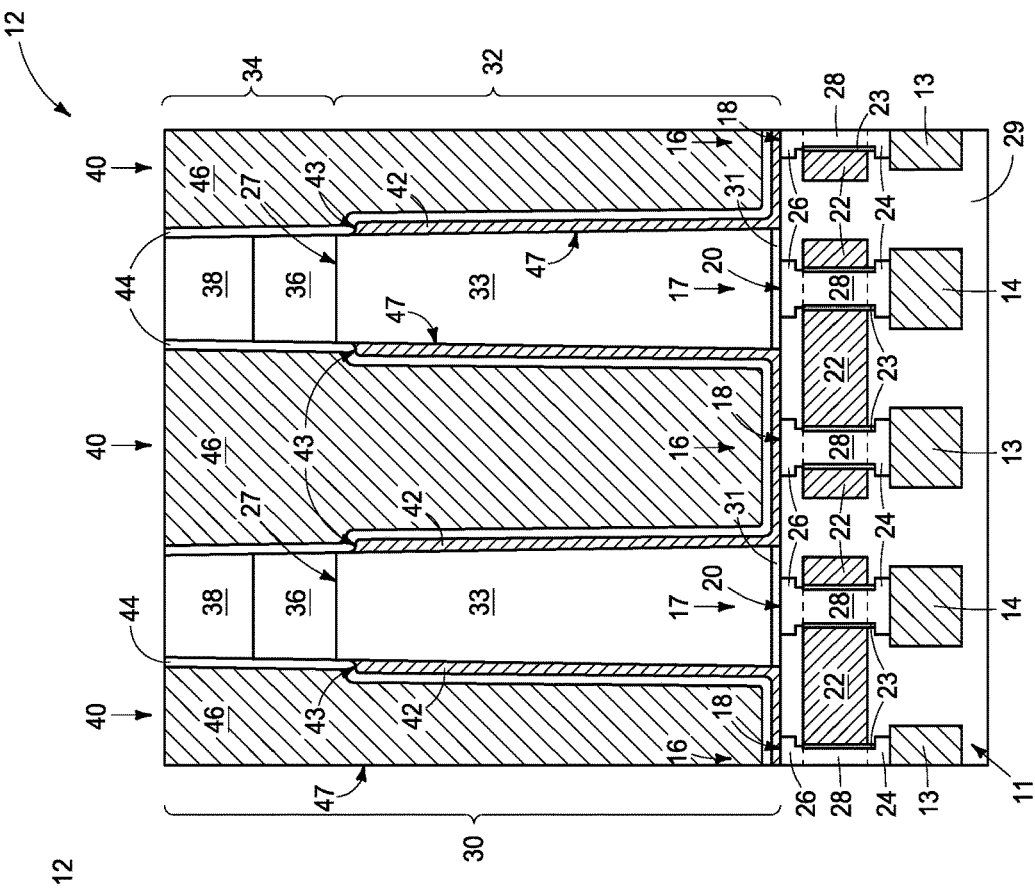
FIG. 13 is a cross-sectional view taken through line 13-13 in FIG. 12.
Figure 12:
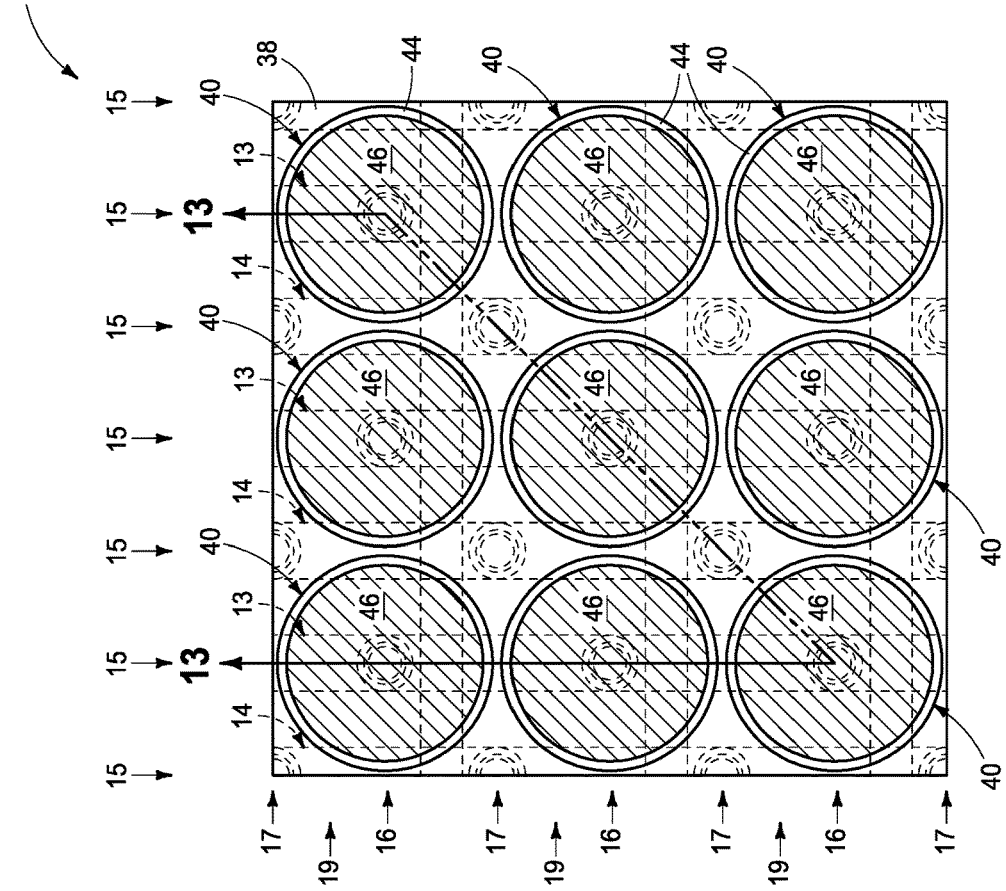
FIG. 12 is a view of the FIG. 10 construction at a processing step subsequent to that shown by FIG. 10.

Referring to FIGS. 12 and 13, conductive material has been deposited over capacitor insulator 44, followed by planarizing it and capacitor insulator 44 back at least to a top of material 34, thus forming a conductive second capacitor node 46. The conductive materials of capacitor nodes 46 and 42 may be of the same or different composition relative one another. Regardless, features 42, 44, and 46 collectively form a pillar 47, in one embodiment and as shown a capacitor pillar, in individual openings 40. Pillar 47 may be hollow (not shown) or may be, from side-to-side, entirely solid from top to bottom in horizontal cross-section (i.e., such includes no hollow central or other hollow portion and/or is not of a container-like shape), for example as shown.

Figure 14:
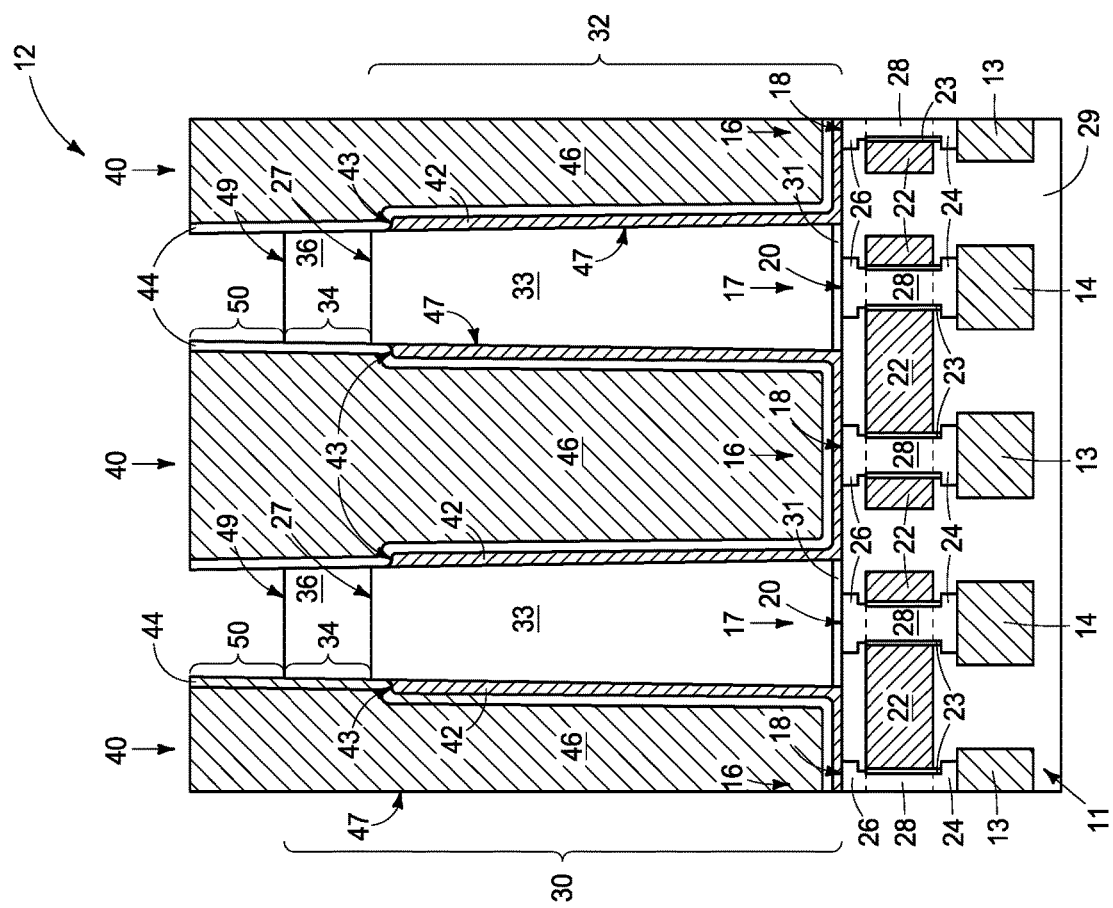
FIG. 14 is a view of the FIG. 13 construction at a processing step subsequent to that shown by FIG. 13.

Referring to FIG. 14, material 30 in which openings 40 were formed has been recessed to result in uppermost portions 50 of pillars 47 projecting elevationally outward relative to an upper surface 49 of material 30, thus the elevationally outermost portion of material 30 in FIG. 3 being sacrificial. In one embodiment and as shown, at least some of material 34 has been removed elevationally inward to form upper surfaces 49 relative to which the pillars project elevationally outward, and in one embodiment as shown comprises etching away all of elevationally outer material 38 (not shown) selectively relative to elevationally inner material 36. In this document, a selective etch or removal is an etch or removal where one material is removed relative to another stated material at a rate of at least 2:1. Alternately and by way of example only, only a single composition material (not shown) may be used (e.g., no different composition layers 36 and 38), for example with etching back to produce a construction analogous to that shown in FIG. 14 being conducted by a timed etch of material 34 without separate etch-stop material 36.

Figure 17:
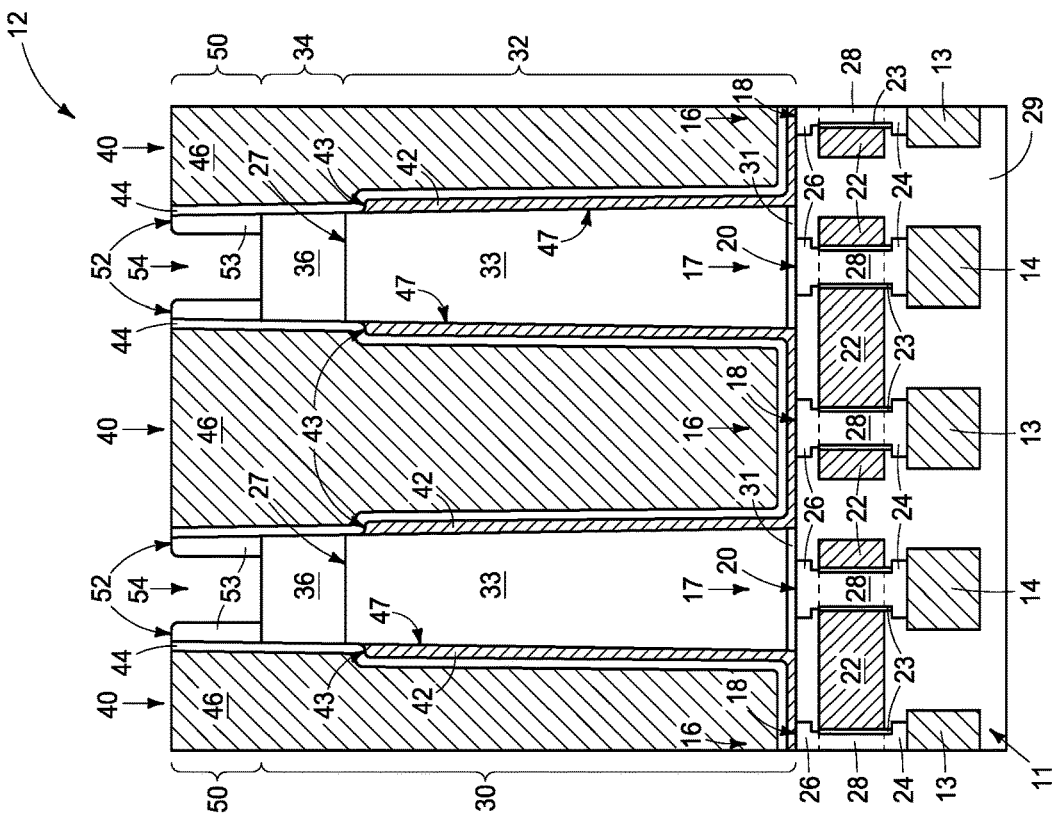
FIG. 17 is a cross-sectional view taken through line 17-17 in FIG. 15.
Figure 15:
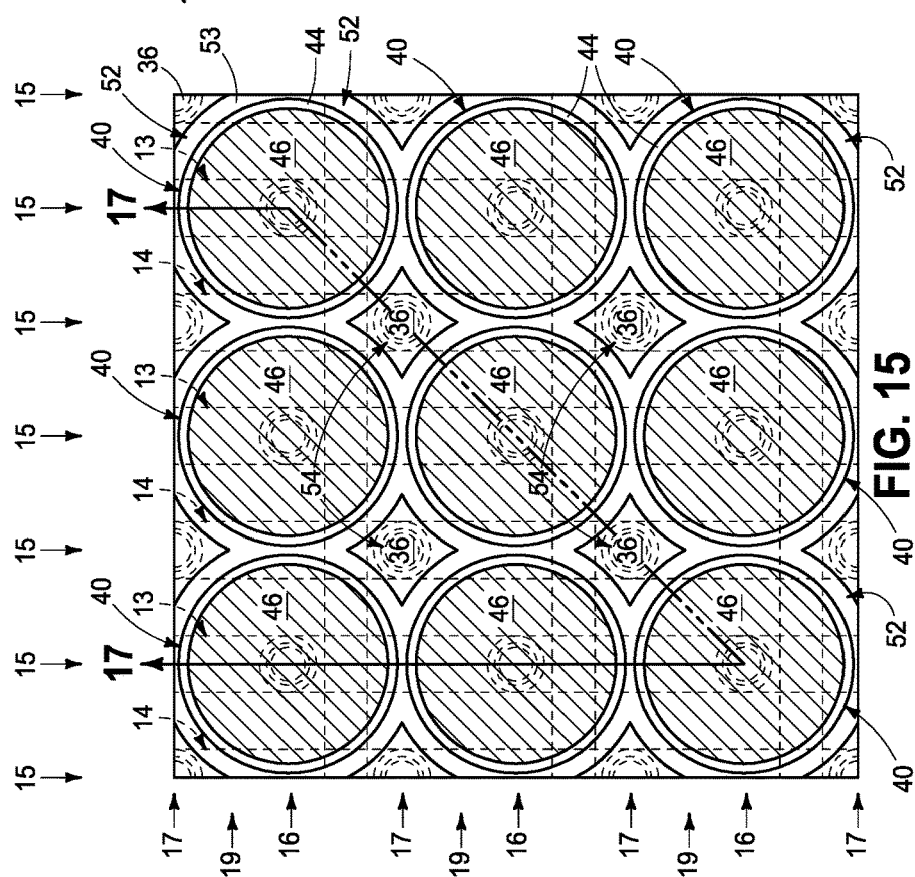
FIG. 15 is a top plan view of the FIG. 14 construction at a processing step subsequent to that shown by FIG. 14.
Figure 16:
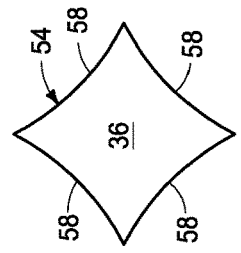
FIG. 16 is an enlarged view of a portion of FIG. 15.

Referring to FIGS. 15-17, a ring 52 of masking material 53 has been formed circumferentially about projecting portions 50 of individual pillars 47. Rings 52 form individual mask openings 54 defined by four immediately-surrounding rings 52 in immediately-adjacent rows 16. Mask openings 54 are between immediately-diagonally-adjacent openings 40 in immediately adjacent rows 16. Material 53 of rings 52 may be entirely sacrificial and, accordingly, may comprise any conductive, insulative, and/or semiconductive material(s). Rings 52 may be formed, by way of ideal example, by deposition of material 53, followed by maskless anisotropic spacer-like etching thereof. In one embodiment and as perhaps best shown in the enlarged view of FIG. 16, at least an elevationally outer portion of individual mask openings 54 are of a four-sided diamond shape in horizontal cross-section. The example depicted four-sided diamond shape of mask openings 54 may be considered as comprising four sides 58. In one embodiment and as shown, the four-sides 58 are individually concave, and in one such embodiment as shown are circularly concave. Lateral deposition thickness of material 53, and thereby lateral thickness of a portion of rings 52, may be sub-lithographic (i.e., where lithography is used) and/or less than ½F ("F" being defined below). Additionally, openings 54 may have respective maximum horizontal dimensions that are sub-½F and/or sub-lithographic Referring to FIGS. 18 and 19, rings 52 and pillars 47 have been used as a mask while etching material 30 through mask openings 54 to form individual via openings 60 to individual first nodes 26 of individual second transistors 20. Such may be conducted using any suitable anisotropic etching chemistry or chemistries and techniques, whether existing or yet-to-be-developed. If individual mask openings 54 are of a four-sided diamond shape in horizontal cross-section, that shape may transfer wholly, partially, or not at all to the bottom of via openings 60.

Figure 20:
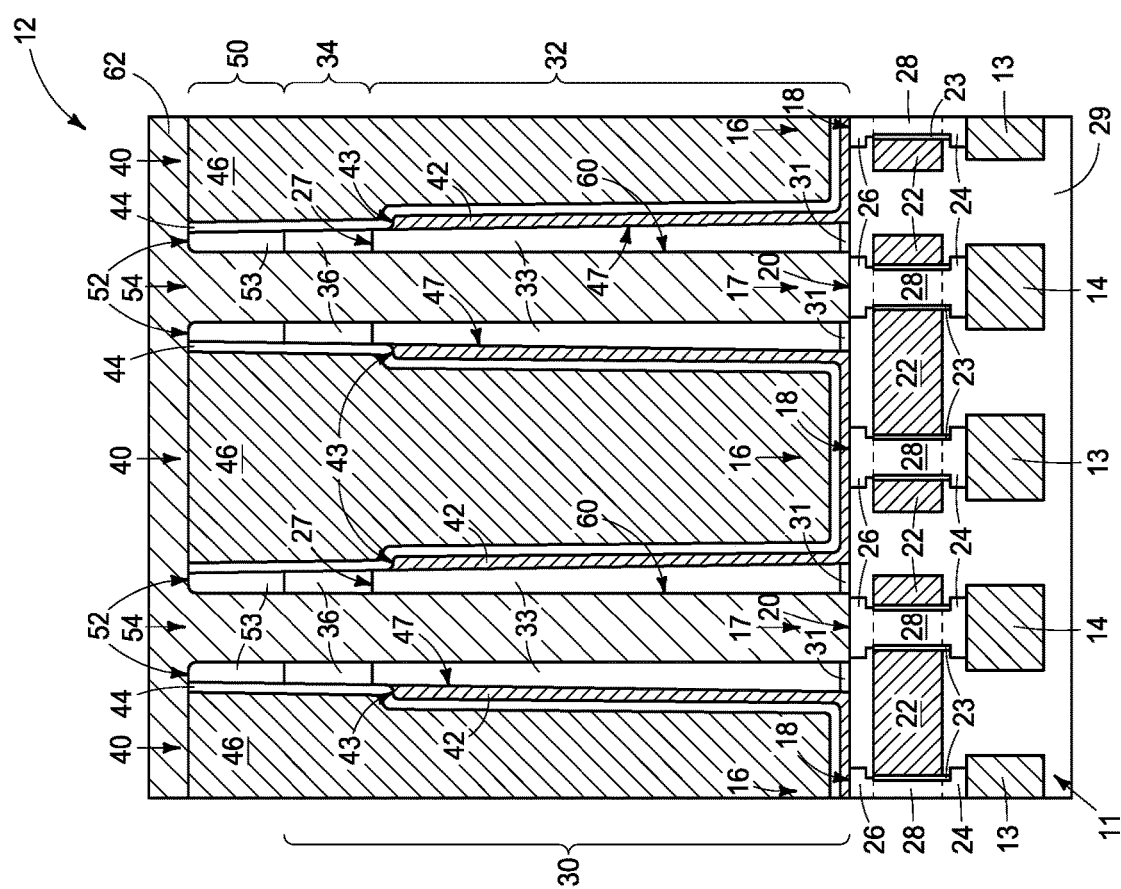
FIG. 20 is a view of the FIG. 19 construction at a processing step subsequent to that shown by FIG. 19.

Referring to FIG. 20, conductive material 62 has been formed in individual via openings 60 to electrically couple (in one embodiment, directly electrically couple) to first nodes 26 of second transistors 20. Conductive material 62 may be of the same or different composition as that of capacitor nodes 42 and/or 46. In one embodiment and as shown, conductive material 62 is deposited to overfill via openings 60 and be elevationally outward of rings 52 and pillars 47.

Referring to FIGS. 21 and 22, projecting portions 50 (not shown) of capacitor pillars 47 and rings 52 (not shown) have been removed from being above material 30 (and material 33), thus forming pillars 67 of conductive material 62 and forming capacitors 71 comprising capacitor insulator 44 and capacitor nodes 42 and 46. Such may occur by any existing or yet-to-be-developed technique, for example by etching, resist etch-back, or chemical mechanical polishing. In one embodiment and as shown, such removal has been sufficient to remove material 36 (not shown) completely from the substrate, for example back at least to top 27 of dielectric material 33. In one embodiment and as shown, at least most (i.e., more than half up to and including all) of the removing of projecting portions 50 (not shown) and rings 52 (not shown) occurs after forming conductive material 62 within via openings 60. In one embodiment, conductive pillars 67 have an elevationally outer portion that is of four-sided diamond shape in horizontal cross-section. In such embodiment, conductive pillars 67 may have their entire elevational thicknesses in respective horizontal cross-sections of a four-sided diamond shape, or may have elevationally inner portions thereof not of such shape.

Figure 24:
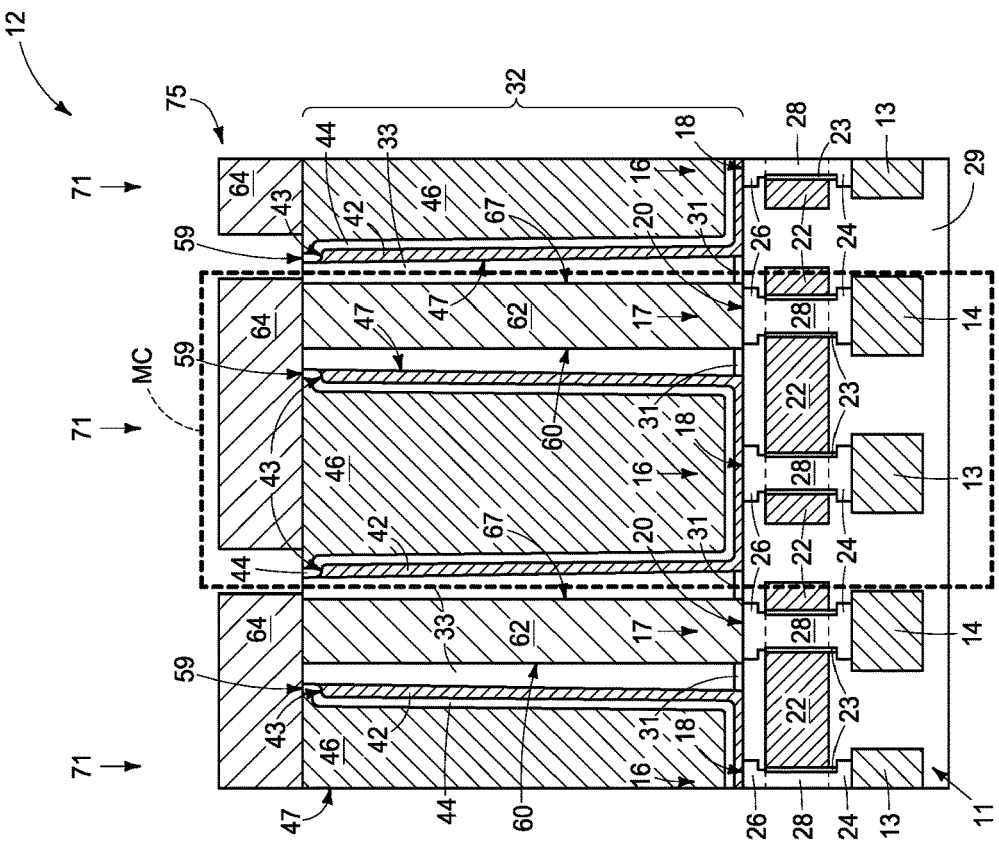
FIG. 24 is a cross-sectional view taken through line 24-24 in FIG. 23.
Figure 23:
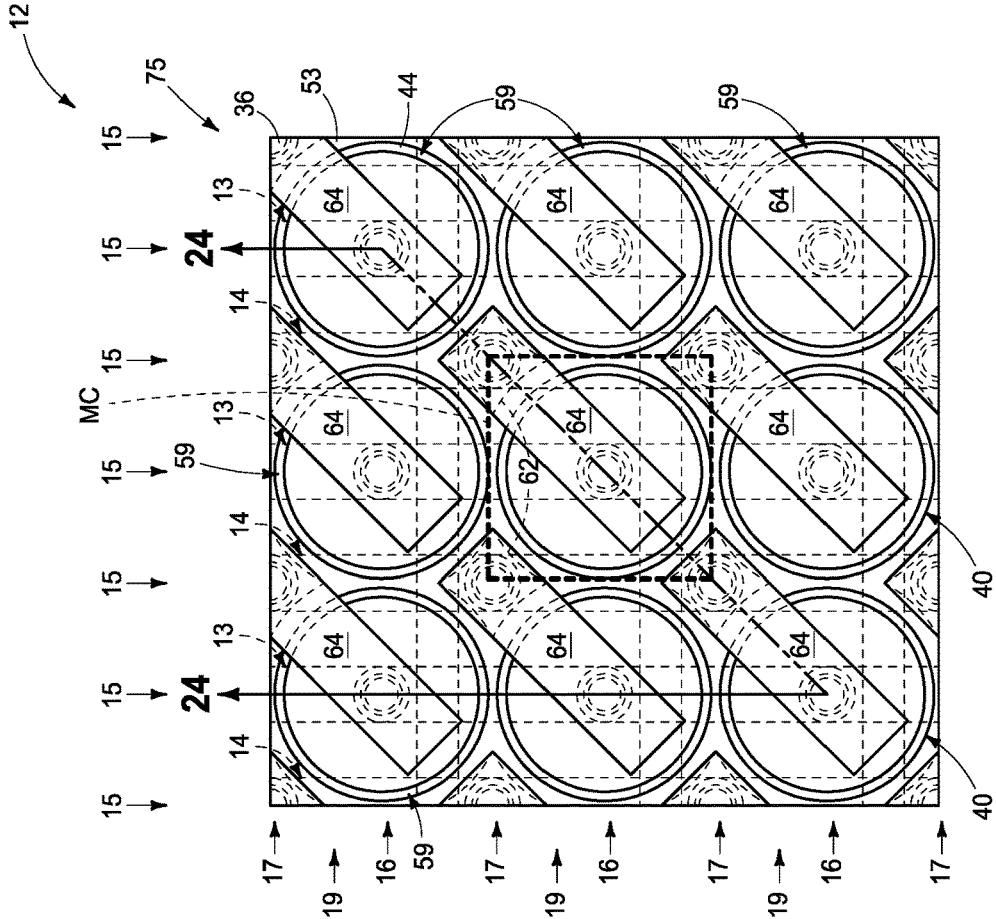
FIG. 23 is a view of the FIG. 21 construction at a processing step subsequent to that shown by FIG. 21.

Referring to FIGS. 23 and 24, conductive material 64 has been deposited and patterned to electrically couple (in one embodiment directly electrically couple) to conductive material 62 in individual via openings 60 with one of four immediately-surrounding capacitor pillars 47, thus forming individual 2T-1C memory cells MC (only one outline MC being shown in FIGS. 23 and 24 for clarity) of an array 75 of such memory cells. Within an individual row 19, immediately-adjacent pairs of sense lines 13, 14 may be BL-T and BL-C in the FIG. 1 schematic.

Conductive material 64 as shown may be formed by subtractive patterning and etch with or without pitch multiplication, damascene processing with or without pitch multiplication, etc. Regardless and in one embodiment, the above example processing shows conducting the forming of conductive material 62 in via openings 60 and the electrically coupling of those via openings to one of the four immediately-surrounding capacitor pillars 47 in two separate time-spaced conductive material-deposition steps. Conductive material 64 may be of the same or different composition as that of conductive material 62 and the conductive materials of capacitor nodes 42 and/or 46.

Conductive materials 62 and 64 effectively constitute a part of second capacitor node 46 (and accordingly capacitor 71) the result of such materials being directly electrically coupled relative one another (e.g., conductive material 64 being directly against conductive material of capacitor nodes 46 within openings 40, and conductive material 62 being directly against conductive material 64). Accordingly, and in one embodiment, second capacitor node 46/64/62 is directly against a top 59 of capacitor insulator 44. Regardless, and in one embodiment, second capacitor node 46/64/62 is directly above first node 26 of second transistor 20, and in one embodiment is also directly above first node 26 of first transistor 18. In one embodiment and as shown, first capacitor node 42 is directly electrically coupled to first node 26 of first transistor 18 and second capacitor node 46/64/62 is directly electrically coupled to first node 26 of second transistor 20. In one embodiment and as shown, pillar 67 and second transistor 20 are longitudinally coaxial.

Figure 19:
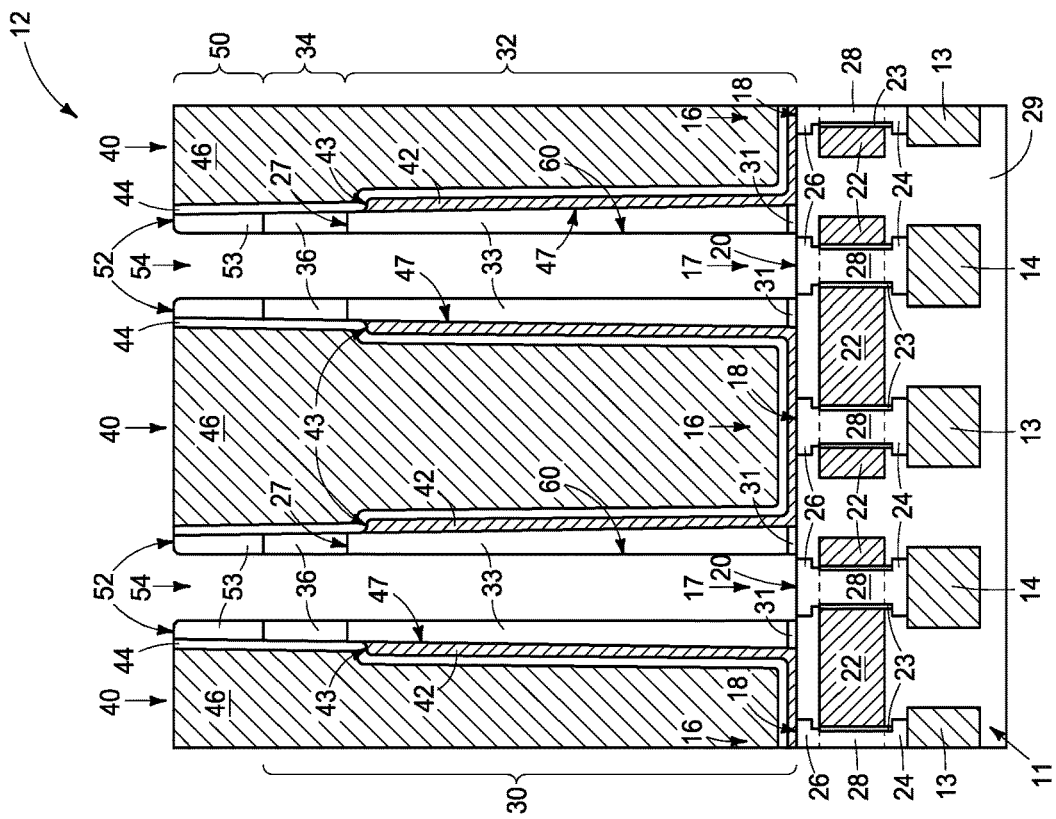
FIG. 19 is a cross-sectional view taken through line 19-19 in FIG. 18.
Figure 18:
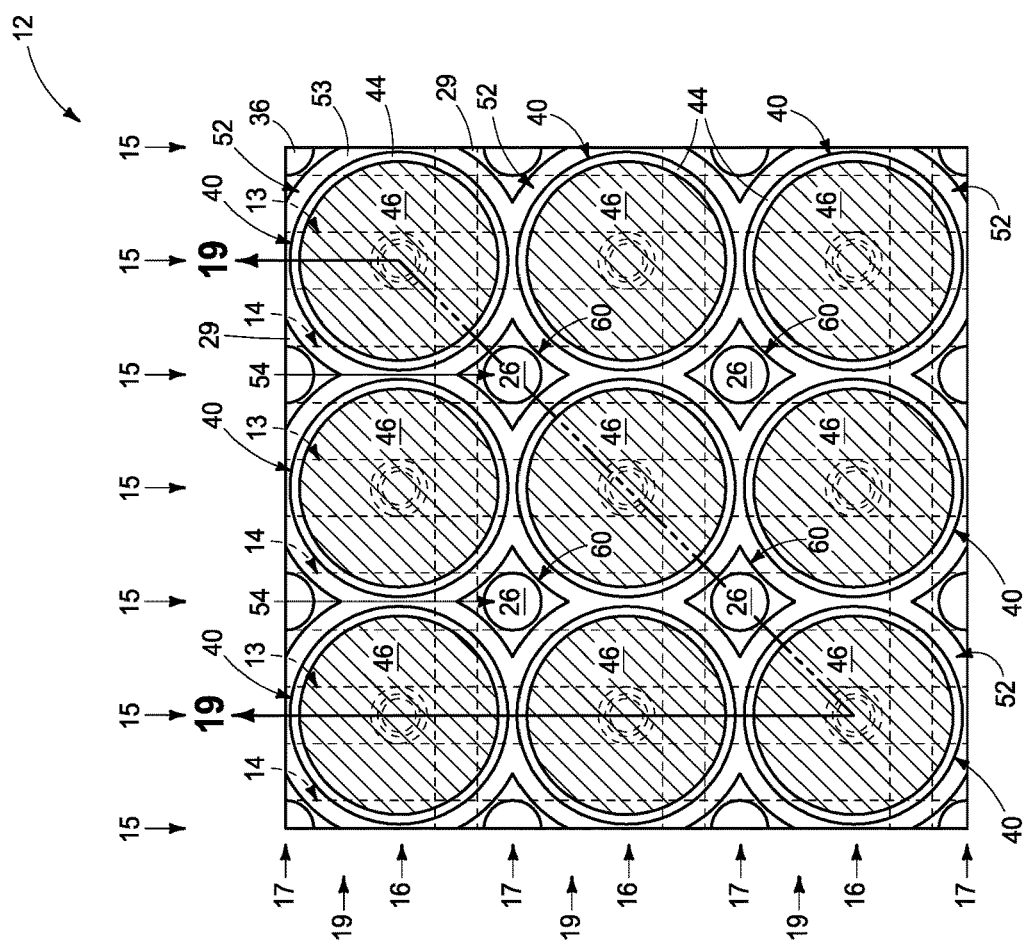
FIG. 18 is a view of the FIG. 15 construction at a processing step subsequent to that shown by FIG. 15.

Embodiments of the invention encompass methods independent of forming an array of 2T-1C memory cells, independent of forming memory cells, and independent of forming capacitors. For example, an embodiment of the invention encompasses a method of forming a plurality of rows (e.g., 16) of pillar openings (e.g., 40) that are inter-row aligned (e.g., as shown FIG. 8, and regardless of whether those openings will contain a capacitor or other component of a memory cell or of integrated circuitry). A pillar is formed in individual of the pillar openings (e.g., 47, and independent of whether such comprises a material of a capacitor or other operative circuit component that remains as part of the finished circuitry construction). The pillars are formed to project elevationally outward relative to an upper surface of material in which the pillar openings were formed (e.g., as shown in FIG. 14, and independent of technique by which the pillars are formed to be so-projecting). A ring of masking material (e.g., 52 of material 53) is formed circumferentially about the individual pillars. The rings form individual mask openings (e.g., 54) defined by four immediately-surrounding of the rings that are in immediately-adjacent of the rows, with the rings being between immediately-diagonally-adjacent of the pillar openings. The rings and pillars are used as a mask while etching the material in which the pillar openings were formed through the mask openings (e.g., as shown in FIGS. 18 and 19) to form individual via openings (e.g., 60) that are between the immediately-diagonally-adjacent pillar openings. Conductive material (e.g., 62) is formed in the via openings electrically coupled (e.g., by material 64, and in one embodiment directly electrically coupled) to an operative circuit component (e.g., 71, and independent of whether that circuit component is a capacitor) formed in one of four of the pillar openings that immediately surround the individual via openings.

In one embodiment, the operative circuit component comprises a capacitor, and the pillar is formed to comprise conductive material (e.g., material of capacitor node 46) and capacitor insulator (e.g., 44) of the capacitor and that remains as part of the finished circuitry construction. Portions of the pillars that project elevationally outward comprise the conductive material and the capacitor insulator. In one embodiment, the capacitor comprises two nodes (i.e., conductive) separated by the capacitor insulator and the conductive material of only one of the nodes projects elevationally outward relative to the upper surface of the material in which the pillar openings were formed (e.g., materials 46 and 44 as shown in FIG. 14 projecting relative to surface 49).

Any other attribute(s) or aspect(s) as described herein and/or shown may be used.

Figure 26:
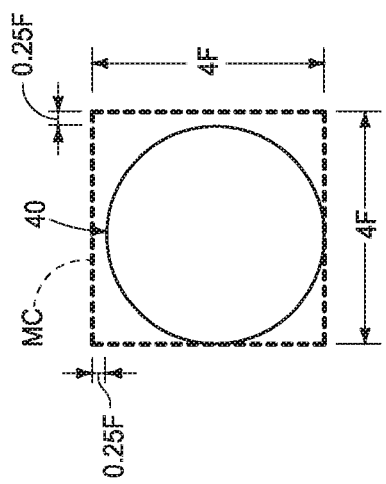
FIG. 26 is a redacted and enhanced view of a portion of FIG. 25.
Figure 25:
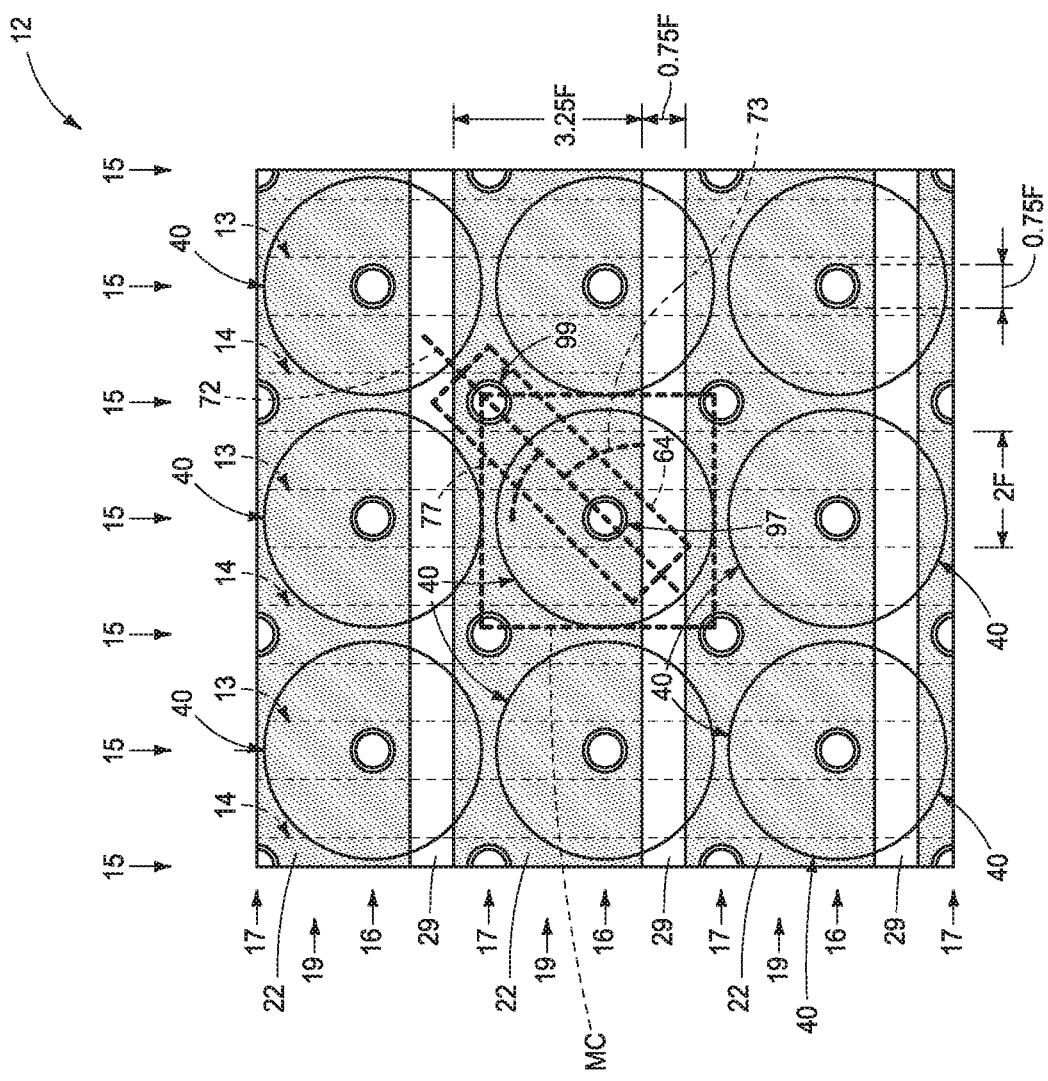
FIG. 25 is a redacted and enhanced diagrammatic top plan view of the memory array per the FIG. 23 construction in accordance with an embodiment of the invention.

The example above-described processing and resultant example construction as shown, by way of example only, has the following attributes, and any aspect of which may be different in different embodiments. Dimensions and density with respect to the illustrated features may be considered with respect to a straight-line dimension "F" which is one of a) one-half of the minimum digit line pitch, or b) digit line maximum width. FIG. 25 is a redacted and enhanced version of FIG. 23 to more clearly show "F", and FIG. 26 is a redacted version of FIG. 25 to show area occupied by a single memory cell MC. Maximum digit line width and minimum space there-between are equal in construction 12 (i.e., each equals F). Combined diameter of channel 28 and gate insulator 23 is 0.75F. Intra-row and inter-row spacing between immediately-adjacent capacitor openings 40 are equal to one another, and is 0.25F. Maximum access line width is 3.25F and minimum space between immediately-adjacent access lines 22 is 0.075F. Thereby, memory cell y-direction pitch and x-direction pitch each equal 4F, thereby with individual memory cells MC occupying a maximum area of 16F$^2$ (i.e., area occupied by a single unit cell of the memory array). Alternate configurations and/or alternate of any one or more of these dimensions may be used. By way of examples only, four alternate configurations are described below with respect to FIGS. 27/28, 29/30, 31/32, and 33/34.

Figure 28:
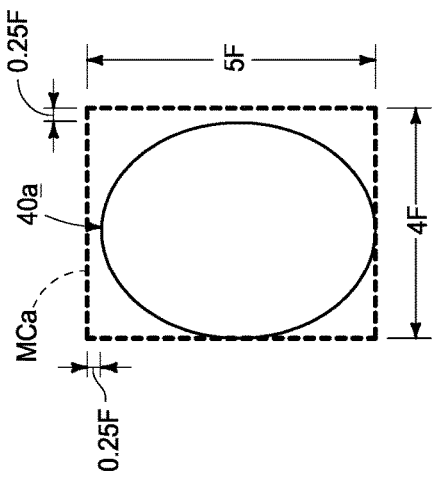
Figure 27:
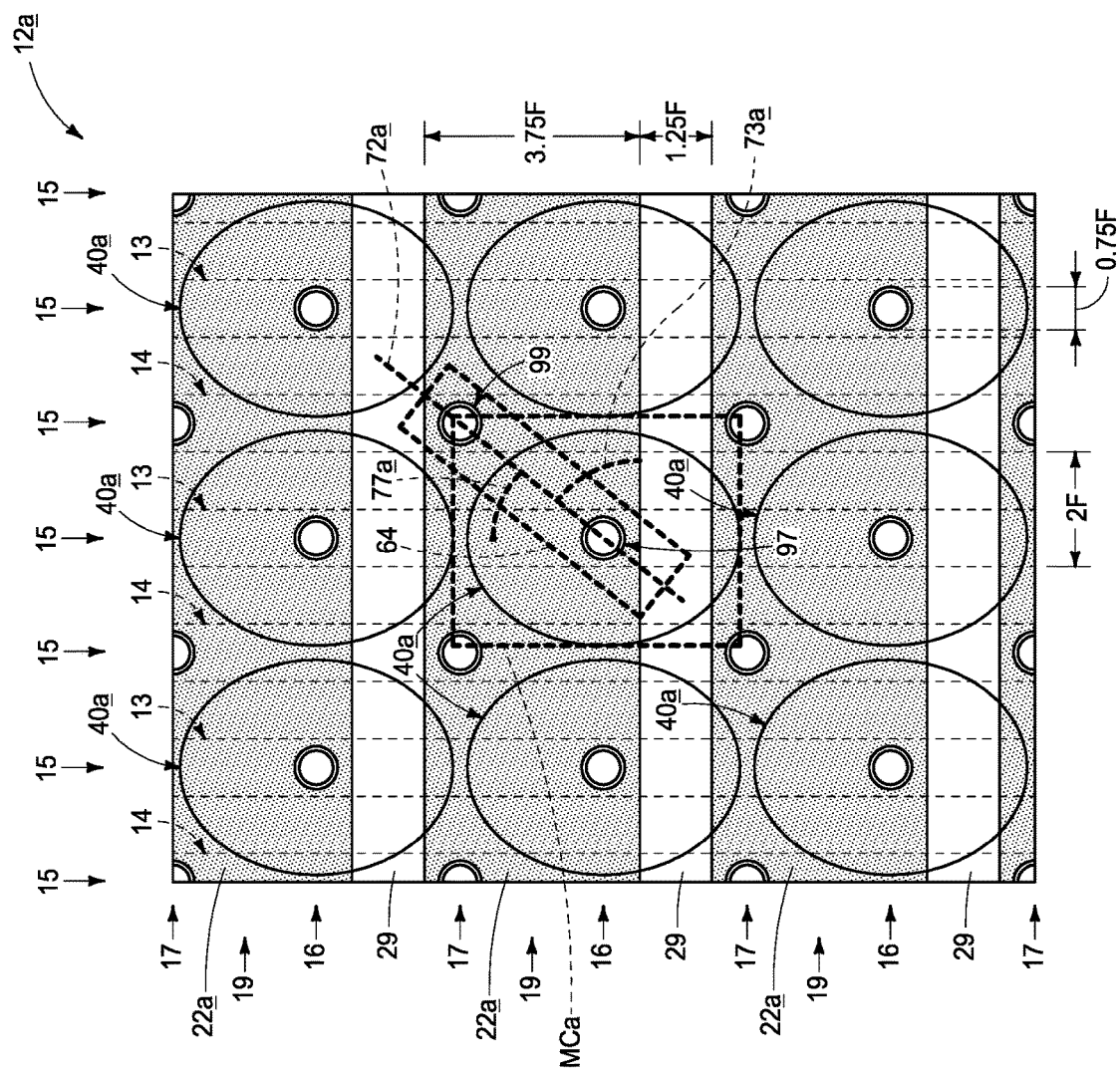
FIGS. 27 and 29 are diagrammatic top plan views of arrays in accordance with embodiments of the invention, with FIGS. 28 and 30 being respective redacted and enhanced portions thereof.

Specifically, FIGS. 27 and 28 show an alternate example construction 12a. Like numerals from the above-described embodiments have been used where appropriate, with some construction differences being indicated with the suffix "a". Construction 12a as compared to construction 12 has an example y-direction stretch of 1F to a total of 5F, while keeping x-dimensions the same, resulting in individual memory cells MCa being 4F by 5F and individual memory cells thereby occupying a maximum area of 20F$^2$. FIG. 27 shows such y-direction stretch being 0.5F with respect to minimum space between immediately-adjacent access lines 22a, specifically from 0.75F in construction 12 to 1.25F in construction 12a. FIG. 27 also additional shows y-direction stretch being 0.5F with respect to maximum width of access lines 22a, specifically from 3.25F in construction 12 to 3.75F in construction 12a. In one embodiment and as shown, capacitors openings 40a and accordingly resultant capacitors are arrayed in a 2D rectangular Bravais lattice (as may be more readily perceived by rotating the sheet upon which FIG. 27 lies 90°). Any other attribute(s) or aspect(s) as described herein and/or shown may be used.

Figure 30:
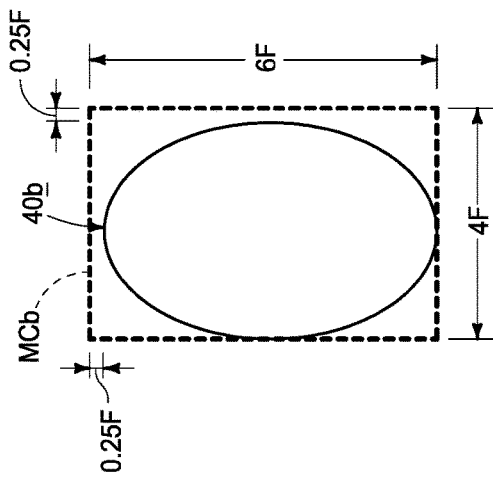
Figure 29:
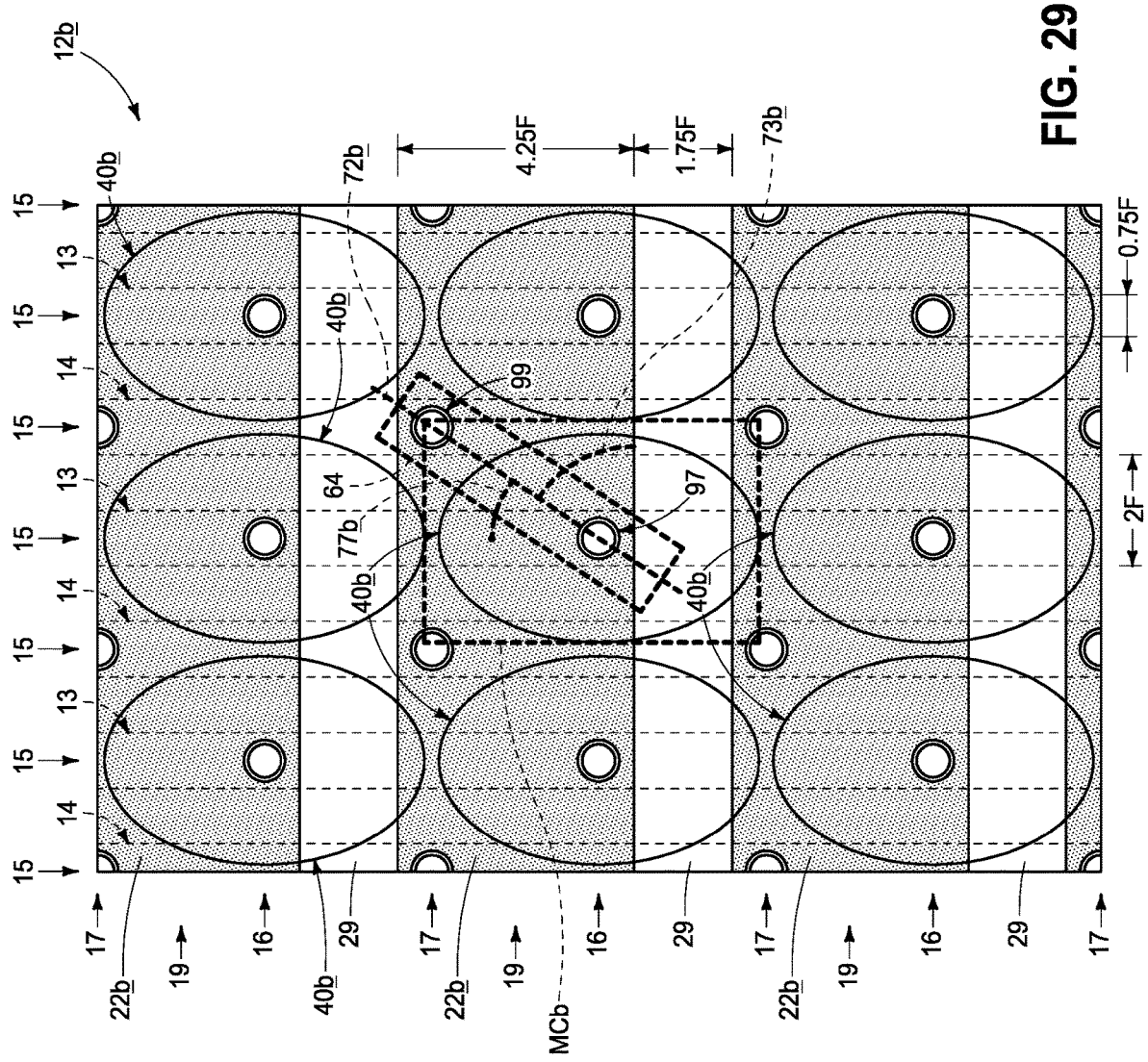

FIGS. 29 and 30 show an alternate example construction 12b. Like numerals from the above-described embodiments have been used where appropriate, with some construction differences being indicated with the suffix "b". Construction 12b has 1.75F minimum spacing between immediately-adjacent access lines 22b and has access line maximum width of 4.25F, resulting in a 4F by 6F individual memory cell MCb occupying a maximum area of 24F$^2$. Any other attribute(s) or aspect(s) as described herein and/or shown may be used.

Figure 32:
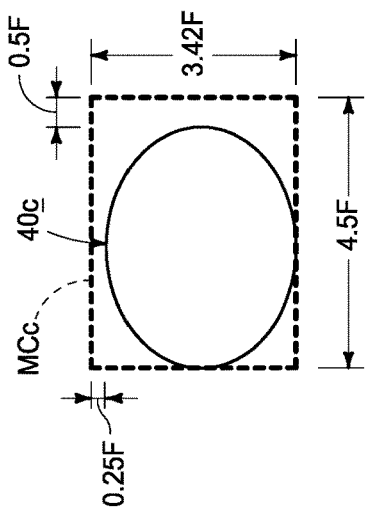
Figure 31:
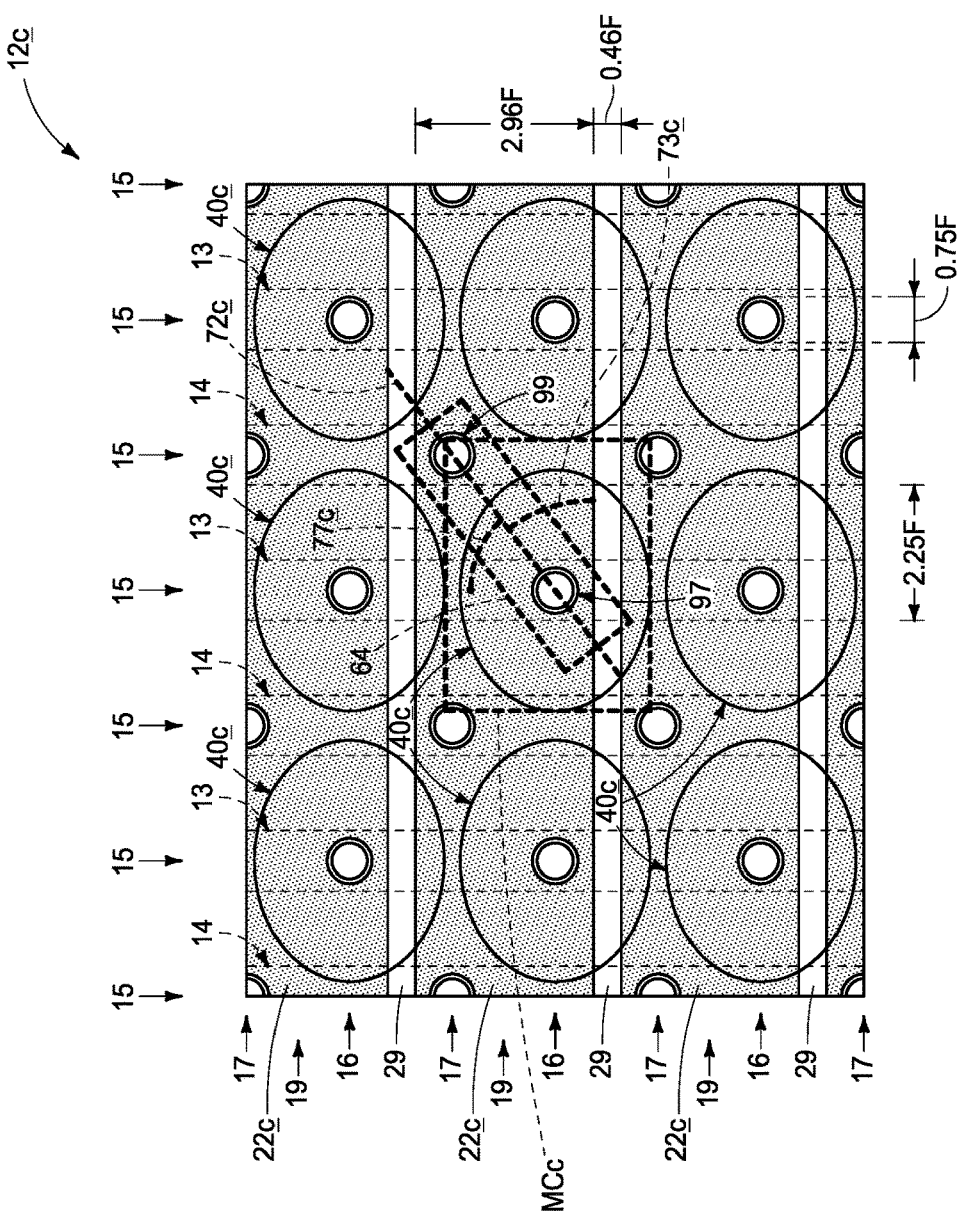
FIGS. 31 and 33 are diagrammatic top plan views of arrays in accordance with embodiments of the invention, with FIGS. 32 and 34 being respective redacted and enhanced portions thereof.

One or both of x-direction and y-direction dimensions may also be shrunk (i.e., reduced). For example, FIGS. 31 and 32 show an alternate example construction 12c. Like numerals from the above-described embodiments have been used where appropriate, with some construction differences being indicated with the suffix "c". Intra-row spacing between immediately-adjacent capacitor openings 40c is 0.5F. Inter-row spacing between immediately-adjacent capacitor openings 40c is 0.25F. Construction 12c has 0.46F minimum spacing between immediately-adjacent access lines 22c and access line maximum width of 2.96F ("F" being equal to digit line maximum width). Minimum space between immediately-adjacent digit lines is 1.25F, thereby resulting in a 4.5F by 3.42F individual memory cell MCc occupying a maximum area 15.39F$^2$. Any other attribute(s) or aspect(s) as described herein and/or shown may be used.

Figure 34:
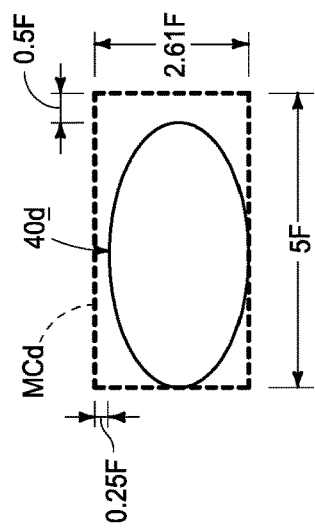
Figure 33:
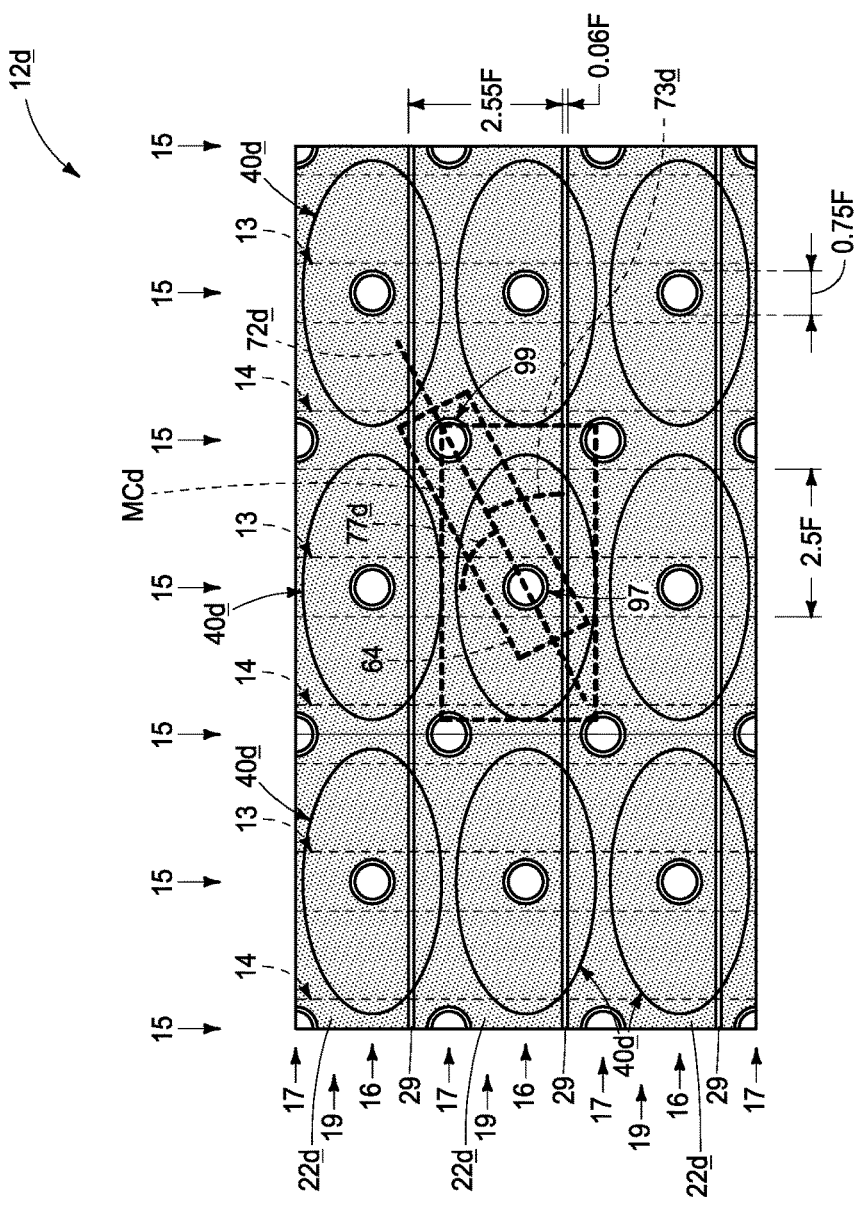

FIGS. 33 and 34 show an alternate example construction 12d. Like numerals from the above-described embodiments have been used where appropriate, with some construction differences being indicated with the suffix "d". Intra-row spacing between immediately-adjacent capacitor openings 40d is 0.5F. Inter-row spacing between immediately-adjacent capacitor openings 40d is 0.25F. Construction 12d has 0.06F minimum spacing between immediately-adjacent access lines 22d and access line maximum width of 2.55F ("F" being equal to digit line maximum width). Minimum space between immediately-adjacent digit lines is 1.5F, thereby resulting in a 5F by 2.61F individual memory cell MCd occupying a maximum area of 13.05F$^2$. Any other attribute(s) or aspect(s) as described herein and/or shown may be used.

Embodiments of the invention encompass memory cells and arrays of memory cells independent of method of manufacture. Nevertheless, any such memory cells and arrays may have any of the attributes as described above with respect to structure in the method embodiments. Further, any method embodiment may have any of the attributes described below with respect to structure embodiments. In one embodiment, a memory cell (e.g., MC) comprises first and second transistors (e.g., 18, 20, respectively) laterally displaced relative one another and a longitudinally-elongated access line 22 that is common to the first and second transistors. A capacitor (e.g., 71) is above the first and second transistors and comprises a conductive first capacitor node (e.g., 42) electrically coupled (in one embodiment directly electrically coupled) to a first node (e.g., 26) of the first transistor. A conductive second capacitor node (e.g., 46/64/62) is electrically coupled (in one embodiment directly electrically coupled) to a first node (e.g., 26) of the second transistor. A capacitor insulator (e.g., 44) is between the first and second capacitor nodes. The second capacitor node comprises a first elevationally-extending conductive pillar (e.g., 46) above the first node of the first transistor. A second elevationally-extending conductive pillar (e.g., 67) is above the first node of the second transistor. Conductive material (e.g., 64) is atop, extends between, and directly electrically couples together the first and second pillars. The conductive material is longitudinally-elongated (e.g., along a line 72 in FIG. 25) at an angle (i.e., any angle other than the straight angle herein and e.g., angle 73 in FIG. 25 which is shown as 45°) relative to longitudinal orientation (e.g., along a row line 19) of the longitudinally-elongated access line within the memory cell. In one embodiment, the angle is at least 25° relative to the longitudinal orientation of the longitudinally-elongated access line within the memory cell. In one embodiment, such angle is 25° to 60°, in one such embodiment is more than 45°, in one such embodiment is less than 45°, and in one such embodiment is 45°. Corresponding lines 72a, 72b, 72c, and 72d are shown in FIGS.

27, 29, 31, and 33, respectively. Corresponding angles 73*a*, 73*b*, 73*c*, and 73*d* are shown in FIGS. 27, 29, 31, and 33, respectively, and are 51°, 56°, 37°, and 28°, respectively.

In one embodiment, the first and second transistors are each elevationally-extending, and in one embodiment are in a common horizontal plane relative one another. In one embodiment, the second capacitor node is directly against a top of the capacitor insulator, and in one embodiment is directly above the first node of the second transistor, and in one embodiment is directly above the first node of the first transistor. In one embodiment, the first capacitor node is directly above the first node of the first transistor. In one embodiment, the first capacitor node is directly electrically coupled to the first node of the first transistor and the second capacitor node is directly electrically coupled to the first node of the second transistor. In one embodiment, the first capacitor node and the first transistor are longitudinally coaxial. In one embodiment, the second pillar has an elevationally outer portion that is of four-sided diamond shape in horizontal cross-section.

Any other attribute(s) or aspect(s) as described herein and/or shown may be used.

In one embodiment, a memory cell (e.g., MC) comprises first and second transistors (e.g., 18, 20, respectively) laterally displaced relative one another. A capacitor (e.g., 71) is above the first and second transistors and comprises a conductive first capacitor node (e.g., 42) electrically coupled (in one embodiment directly electrically coupled) to a first node (e.g., 26) of the first transistor. A conductive second capacitor node (e.g., 46/64/62) is electrically coupled (in one embodiment directly electrically coupled) to a first node 26 of the second transistor. A capacitor insulator (e.g., 44) is between the first and second capacitor nodes. The second capacitor node comprises a first elevationally-extending conductive pillar (e.g., 46) above the first node of the first transistor. A second elevationally-extending conductive pillar (e.g., 67) is above the first node (e.g., 26) of the second transistor. Conductive material (e.g., 64) is atop, extends between, and directly electrically couples together the first and second pillars. A first digit line (e.g., 13) is electrically coupled to a second node (e.g., 24) of the first transistor and a second digit line (e.g., 14) is electrically coupled to a second node (e.g., 24) of the second transistor. The first and second digit lines are longitudinally-elongated. Such conductive material of the second capacitor node is longitudinally-elongated (e.g., along line 72 in FIG. 25) at an angle (e.g., angle 77 in FIG. 25 which is shown as 45°) other than 90° relative to longitudinal orientation (e.g., along column lines 15) of each of the first and second longitudinally-elongated digit lines. In one embodiment, such angle is 30° to 65°, in one such embodiment is more than 45°, in one such embodiment is less than 45°, and in one such embodiment is 45°. Corresponding angles 77*a*, 77*b*, 77*c*, and 77*d* are shown in FIGS. 27, 29, 31, and 33, respectively, and are 39°, 34°, 53°, and 62°, respectively. In one embodiment, the first capacitor node comprises a container shape. In one embodiment, the second transistor is a vertical transistor, and the second pillar and the second transistor are longitudinally coaxial.

Any other attribute(s) or aspect(s) as described herein and/or shown may be used.

In one embodiment, a memory cell (e.g., MC) comprises first and second transistors (e.g., 18, 20, respectively) laterally displaced relative one another and an access line (e.g., 22) that is common to the first and second transistors. A capacitor (e.g., 71) is above the first and second transistors. The capacitor comprises a conductive first capacitor node (e.g., 42) electrically coupled (in one embodiment directly electrically coupled) to a first node (e.g., 26) of the first transistor. A conductive second capacitor node (e.g., 46/64/62) is electrically coupled to a first node (e.g., 26) of the second transistor. A capacitor insulator (e.g., 44) is between the first and second capacitor nodes. A second node (e.g., 24) of the first transistor is electrically coupled (in one embodiment directly electrically coupled) to a first digit line (e.g., 13) at a first longitudinal location (e.g., 97 in FIGS. 25, 27, 29, 31, and 33) along the first digit line. A second node (e.g., 24) of the second transistor is electrically coupled (in one embodiment directly electrically coupled) to a second digit line (e.g., 14) at a second longitudinal location (e.g., 99 in FIGS. 25, 27, 29, 31, and 33) along the second digit line. The first and second digit lines are parallel relative one another within the memory cell. A horizontal line (e.g., 72) through centers of the first and second longitudinal locations is angled at least 30 (e.g., angle 77, 77*a*, 77*b*, 77*c*, or 77*d*) relative to longitudinal orientation (e.g., along column lines 15) of the first and second digit lines within the memory cell. In one embodiment, such angle is 30° to 65°, in one such embodiment is more than 45°, in one such embodiment is less than 45°, and in one such embodiment is 45°.

In one embodiment, the access line has a maximum width that is greater than that of the first and second digit lines. In one embodiment, the first and second digit lines together have a minimum pitch within the memory cell, and the memory cell, occupies a maximum horizontal area of no more than $24F^2$, where "F" is one of a) one-half of the minimum digit line pitch, or b) digit line maximum width. In one embodiment, the maximum area is no more than $20 F^2$, in one embodiment is no more than $16F^2$, and in one embodiment is no more than $14F^2$.

Any other attribute(s) or aspect(s) as described herein and/or shown may be used.

In one embodiment, a two transistor-one capacitor memory cell (e.g., MC) comprises first and second transistors (e.g., 18, 20, respectively) laterally displaced relative one another. A capacitor (e.g., 71) is above the first and second transistors and comprises a conductive first capacitor node (e.g., 42) directly above and electrically coupled to a first node (e.g., 26) of the first transistor. A conductive second capacitor node (e.g., 46/64/62) is directly above the first and second transistors and electrically couples to a first node (e.g., 26) of the second transistor. A capacitor insulator (e.g., 44) is between the first and second capacitor nodes. The second capacitor node comprises an elevationally-extending conductive pillar (e.g., 46) directly above the first node of the second transistor. A conductive pillar has an elevationally outer portion that is of a four-sided diamond shape in horizontal cross-section. In one embodiment, the four sides of the four-sided diamond shape are individually concave, and in one such embodiment are circularly concave. Any other attribute(s) or aspect(s) as described herein and/or shown may be used.

In one embodiment, an array (e.g., 75) of two transistor-one capacitor memory cells (e.g., MC) comprises columns (e.g., 15) of digit lines (e.g., 13, 14) and rows (e.g., 19) of access lines (e.g., 22). The digit lines comprise first alternating digit lines (e.g., 13) and second alternating digit lines (e.g., 14). The second alternating digit lines individually are between immediately adjacent of the first alternating digit lines. Rows (e.g., 16) of elevationally-extending first field effect transistors (e.g., 18) individually have an elevationally inner (e.g., 24) of their source/drain regions (e.g., 24, 26) electrically coupled to one of the individual first alternating digit lines. Rows (e.g., 17) of elevationally-extending second field effect transistors (e.g., 20) individually have an elevationally inner (e.g., 24) of their source/drain regions (e.g., 24, 26) electrically coupled to one of the individual second alternating digit lines. Channels (e.g., 28) of the first and second transistors are inter-row staggered. Individual of the rows of access lines are operatively adjacent the channels of the first and second transistors. Individual capacitors (e.g., 71) are above individual pairs of one of the first transistors and one of the second transistors. The capacitors individually comprise a first capacitor node (e.g., 42) electrically coupled to the first transistor of the individual pair. A second capacitor node (e.g., 46/64/62) is electrically coupled to the second transistor of the individual pair. A capacitor insulator (e.g., 44) is between the first and second capacitor electrodes. In one embodiment, the capacitors are arrayed in a 2D square Bravais lattice, and in one embodiment are arrayed in a 2D rectangular Bravais lattice. Any other attribute(s) or aspect(s) as described herein and/or shown may be used.

In one embodiment, an array (e.g., 75) of two transistor-one capacitor (2T-1C) memory cells (e.g., MC) comprises rows (e.g., 19) of access lines (e.g., 22) and columns (e.g., 15) of digit lines (e.g., 13, 14). Individual of the columns comprise either a) one digit line (e.g., 13) individually electrically coupling to one source/drain region (e.g., 26) of one of an individual first transistor (e.g., 18) of individual 2T-1C memory cells within the array and interconnecting the first transistors in that column, or b) another digit line (e.g., 14) individually electrically coupling to one source/drain region (e.g., 26) of an individual second transistor (e.g., 20) of the individual 2T-1C memory cell and interconnecting the second transistors in that column.

Individual of the rows comprise an access line (e.g., 22) above the digit lines. The access line extends operatively adjacent transistor channels (e.g., 28) of the first and second transistors and inter-connects the first and second transistors in that row. The individual 2T-1C memory cells comprise a capacitor (e.g., 71) above the first transistor and above the second transistor of the individual 2T-1C memory cell. The capacitor comprises a conductive first capacitor node (e.g., 42) electrically coupled (in one embodiment directly electrically coupled) to the first transistor of the individual 2T-1C memory cell. A conductive second transistor node (e.g., 46/64/62) is electrically coupled to the second transistor of the individual 2T-1C memory cell. A capacitor insulator (e.g., 44) is between the first and second capacitor nodes. The second capacitor node comprises a first elevationally-extending conductive pillar (e.g., 47) above the first node of the first transistor. A second elevationally-extending conductive pillar (e.g., 67) is above the first node of the second transistor. Conductive material (e.g., 64) is atop, extends between, and directly electrically couples together the first and second pillars. Such conductive material is at least one of a) longitudinally-elongated (e.g., along a line 72, 72a, 72b, 72c, or 72d) at an angle (e.g., 77, 77a, 77b, 77c, or 77d) other than 90° relative to the columns of the digit lines, or b) longitudinally-elongated (e.g., along a row line 19) at an angle (e.g., 73, 73a, 73b, 73c, or 73d) relative to the rows of access lines. Any other attribute(s) or aspect(s) as described herein and/or shown may be used.

In one embodiment, an array (e.g., 75) of two transistor-one capacitor (2T-1C) memory cells (e.g., MC) comprises rows (e.g., 19) of access line (e.g., 22) and columns (e.g., 15) of digit lines (e.g., 13, 14). Individual of the columns comprise either a) one digit line (e.g., 13) individually electrically coupling to one source/drain region (e.g., 26) of one of an individual first transistor (e.g., 18) of individual 2T-1C memory cells within the array and interconnecting the first transistors in that column, or b) another digit line (e.g., 14) individually electrically coupling to one source/drain region (e.g., 26) of an individual second transistor (e.g., 20) of the individual 2T-1C memory cell and interconnecting the second transistors in that column. Individual of the rows comprise an access line (e.g., 22) above the digit lines. The access line extends operatively adjacent transistor channels (e.g., 28) of the first and second transistors and inter-connects the first and second transistors in that row. The access line has a maximum width that is greater than that of each of the one and other digit lines. The individual 2T-1C memory cells comprise a capacitor (e.g., 71) above the first transistor and above the second transistor of the individual 2T-1C memory cell. In one embodiment, the maximum width is at least two times greater than that of each of the one and other digit lines, in one embodiment is at least three times greater, and in one embodiment is no more than five times greater than that of the one and other digit lines. Wider access lines may exhibit reduced resistance longitudinally along such lines. Any other attribute(s) or aspect(s) as described herein and/or shown may be used.

Constructions 12, 12a, 12b, 12c, and 12c show transistors 18, 20 as comprising field effect transistors and which extend elevationally. However, any suitable alternate transistors may be used, for example bipolar junction transistors and regardless of whether such extend elevationally.

It is generally desirable, at least in 2T-1C memory array architecture, that the same sign voltage (i.e., positive or negative) is applied to the respective one and other sides of the capacitor electrodes when reading and writing to each memory cell within the array. This is at least because constructions and/or materials of the conductive electrodes of the capacitors may be different relative to one another. If different capacitors in different rows had their capacitor electrodes subjected to opposite sign polarities, different capacitors may have different current vs. voltage profiles for different transistors within the array and which may be highly undesirable. For example, and by way of example only, capacitor electrode 42 and capacitor electrode 46/64/62 of an individual memory cell MC are shown as inherently being of different construction relative to one another regardless of whether both are formed of the same material(s) as the other. It is desirable in 2T-1C memory cell operation, whether read or write, that each capacitor node 42 in the array always have one sign voltage (i.e., positive or negative) and that each capacitor node 46/64/62 always have the opposite sign voltage (i.e., the other of positive and negative). In other words, it is typically desirable that all memory cells within an array have matched access polarities. Constructions as provided herein, for example channel-offset first and second transistors and/or that diagonally connect with respect to one of the capacitor plates between the transistors, may be used to enable all like capacitor electrodes within the array to have the same sign voltage potential for all read and write operations.

CONCLUSION

In some embodiments, a memory cell comprises first and second transistors laterally displaced relative one another and comprising a longitudinally-elongated access line that is common to the first and second transistors. A capacitor is above the first and second transistors and comprises a conductive first capacitor node electrically coupled to a first node of the first transistor. A conductive second capacitor node is electrically coupled to a first node of the second transistor. A capacitor insulator is between the first and second capacitor nodes. The second capacitor node comprises a first elevationally-extending conductive pillar above the first node of the first transistor. A second elevationally-extending conductive pillar is above the first node of the second transistor. Conductive material is atop, extends between, and directly electrically couples together the first and second pillars. The conductive material is longitudinally elongated at an angle relative to longitudinal orientation of the longitudinally-elongated access line within the memory cell.

In some embodiments, a memory cell comprises first and second transistors laterally displaced relative one another. A capacitor is above the first and second transistors and comprises a conductive first capacitor node electrically coupled to a first node of the first transistor. A conductive second capacitor node is electrically coupled to a first node of the second transistor. A capacitor insulator is between the first and second capacitor nodes. The second capacitor node comprises a first elevationally-extending conductive pillar above the first node of the first transistor. A second elevationally-extending conductive pillar is above the first node of the second transistor. Conductive material is atop, extends between, and directly electrically couples together the first and second pillars. A first digit line is electrically coupled to a second node of the first transistor and a second digit line is electrically coupled to a second node of the second transistor. The first and second digit lines are longitudinally elongated. The conductive material of the second capacitor node is longitudinally elongated at an angle other than 90° relative to longitudinal orientation of each of the first and second longitudinally-elongated digit lines.

In some embodiments, a memory cell comprises first and second transistors laterally displaced relative one another and comprises an access line that is common to the first and second transistors. A capacitor is above the first and second transistors. The capacitor comprises a conductive first capacitor node electrically coupled to a first node of the first transistor. A conductive second capacitor node is electrically coupled to a first node of the second transistor. A capacitor insulator is between the first and second capacitor nodes. A second node of the first transistor is electrically coupled to a first digit line at a first longitudinal location along the first digit line and a second node of the second transistor is electrically coupled to a second digit line at a second longitudinal location along the second digit line. The first and second digit lines are parallel relative one another within the memory cell. A horizontal line through centers of the first and second longitudinal locations is angled at least 30° relative to longitudinal orientation of the first and second digit lines within the memory cell.

In some embodiments, A two transistor-one capacitor memory cell comprises first and second transistors laterally displaced relative one another. A capacitor is above the first and second transistors. The capacitor comprises a conductive first capacitor node directly above and electrically coupled to a first node of the first transistor. A conductive second capacitor node is directly above the first and second transistors and is electrically coupled to a first node of the second transistor. A capacitor insulator is between the first and second capacitor nodes. The second capacitor node comprises an elevationally-extending conductive pillar directly above the first node of the second transistor. The conductive pillar has an elevationally outer portion that is of four-sided diamond shape in horizontal cross-section.

In some embodiments, an array of two transistor-one capacitor memory cells comprise columns of digit lines and rows of access lines. The digit lines comprise first alternating digit lines and second alternating digit lines. The second alternating digit lines individually are between immediately adjacent of the first alternating digit lines. Rows of elevationally-extending first field effect transistors individually have an elevationally inner of their source/drain regions electrically coupled to one of the individual first alternating digit lines. Rows of elevationally-extending second first field effect transistors individually have an elevationally inner of their source/drain regions electrically coupled to one of the individual second alternating digit lines. Channels of the first and second transistors are inter-row staggered. Individual of the rows of access lines are operatively adjacent the channels of the first and second transistors. Individual capacitors are above individual pairs of one of the first transistors and one of the second transistors. The capacitors individually comprise a conductive first capacitor node electrically coupled to the first transistor of the individual pair. A conductive second capacitor node is electrically coupled to the second transistor of the individual pair. A capacitor insulator is between the first and second capacitor nodes.

In some embodiments, an array of two transistor-one capacitor (2T-1C) memory cells, where the array comprises rows of access lines and columns of digit lines, has individual of the columns comprising either a) one digit line individually electrically coupling to one source/drain region of one of an individual first transistor of individual 2T-1C memory cells within the array and interconnecting the first transistors in that column, or b) another digit line individually electrically coupling to one source/drain region of an individual second transistor of the individual 2T-1C memory cell and interconnecting the second transistors in that column. Individual of the rows comprise an access line above the digit lines. The access line extends operatively adjacent transistor channels of the first and second transistors and interconnects the first and second transistors along that row. The individual 2T-1C memory cells comprise a capacitor above the first transistor and above the second transistor of the individual 2T-1C memory cell. The capacitor comprises a conductive first capacitor node electrically coupled to the first transistor of the individual 2T-1C memory cell. A conductive second capacitor node is electrically coupled to the second transistor of the individual 2T-1C memory cell. A capacitor insulator is between the first and second capacitor nodes. The second capacitor node comprises a first elevationally-extending conductive pillar above the first node of the first transistor. A second elevationally-extending conductive pillar is above the first node of the second transistor. Conductive material is atop, extends between, and directly electrically couples together the first and second pillars; the conductive material is at least one of a) longitudinally elongated at an angle other than 90° relative to the columns of the digit lines, or b) longitudinally elongated at an angle relative to the rows of access lines.

In some embodiments, an array of two transistor-one capacitor (2T-1C) memory cells, where the array comprises rows of access lines and columns of digit lines, has individual of the columns comprising either a) one digit line individually electrically coupling to one source/drain region of one of an individual first transistor of individual 2T-1C memory cells within the array and interconnecting the first transistors in that column, or b) another digit line individually electrically coupling to one source/drain region of an individual second transistor of the individual 2T-1C memory cell and interconnecting the second transistors in that column. Individual of the rows comprise an access line above the digit lines. The access line extends operatively adjacent transistor channels of the first and second transistors and interconnects the first and second transistors along that row and has a maximum width that is greater than that of each of the one and other digit lines. The individual 2T-1C memory cells comprise a capacitor above the first transistor and above the second transistor of the individual 2T-1C memory cell.

In some embodiments, a method used in fabricating integrated circuitry comprises forming a plurality of rows of pillar openings that are inter-row aligned. A pillar is formed in individual of the pillar openings. The pillars project elevationally outward relative to an upper surface of material in which the pillar openings were formed. A ring of masking material is circumferentially about the individual pillars. The rings form individual mask openings defined by four immediately-surrounding of the rings that are in immediately-adjacent of the rows and that are between immediately-diagonally-adjacent of the pillar openings in the immediately-adjacent rows. The rings and pillars are used as a mask while etching the material in which the pillar openings were formed through the mask openings to form individual via openings that are between the immediately-diagonally-adjacent pillar openings in the immediately-adjacent rows. Conductive material in the individual via openings is directly electrically coupled to an operative circuit component formed in one of four of the pillar openings that immediately surround the individual via openings.

In some embodiments, a method of forming an array of two transistor-one capacitor memory cells comprises forming columns of digit lines. Rows of elevationally-extending first and second field effect transistors are formed to individually have an elevationally inner of their source/drain regions electrically coupled to individual of the digit lines. The first and second transistors comprise access lines above the digit lines, and individual of the first and second transistors comprise a gate comprising part of individual of the access lines. A plurality of capacitor openings are formed to individually extend to an elevationally outer source/drain region of the individual first transistors. A capacitor pillar is formed in individual of the capacitor openings. The capacitor pillar is formed to comprise a conductive first capacitor node electrically coupled to individual of the elevationally outer source/drain regions of the individual first transistors, a conductive second capacitor node, and a capacitor insulator between the first and second capacitor nodes. Material in which the capacitor openings were formed is recessed to result in uppermost portions of the capacitor pillars projecting elevationally outward relative to an upper surface of the material in which the capacitor openings were formed. A ring of masking material is formed circumferentially about the projecting portions of individual of the capacitor pillars. The rings form individual mask openings defined by four immediately-surrounding of the rings in immediately-adjacent of the rows and that are between immediately-diagonally-adjacent of the capacitor openings in the immediately-adjacent rows. The rings and capacitor pillars are used as a mask while etching the material in which the capacitor openings were formed through the mask openings to form individual via openings to individual of elevationally outer source/drain regions of the individual second transistors. The projecting portions of the capacitor pillars are removed as are the rings from being above the material in which the capacitor openings were formed. Conductive material is formed in the individual via openings electrically coupled to the individual elevationally outer source/drain region of the individual second transistors and electrically coupled to one of four immediately-surrounding of the capacitor pillars.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory cell comprising:
   first and second transistors laterally spaced relative to one another and comprising an access line that is a gate of each of the first and second transistors and extends laterally between the first and second transistors along a row line direction; and
   a capacitor above the first and second transistors; the capacitor comprising:
      a conductive first capacitor electrode electrically coupled to a first source/drain region of the first transistor;
      a conductive second capacitor electrode electrically coupled to a first source/drain region of the second transistor;
      a capacitor insulator between the first and second capacitor electrodes; and
      the second capacitor electrode comprising:
         a first conductive pillar above the first source/drain region of the first transistor;
         a second conductive pillar above the first source/drain region of the second transistor; and
         conductive material atop, extending between, and directly electrically coupling together the first and second pillars; the conductive material being elongated within the memory cell at an angle relative to the row line direction.

2. The memory cell of claim 1 wherein the angle is at least 25° from the row line direction.

3. The memory cell of claim 2 wherein the angle is 25° to 60°.

4. The memory cell of claim 3 wherein the angle is more than 45°.

5. The memory cell of claim 3 wherein the angle is less than 45°.

6. The memory cell of claim 3 wherein the angle is 45°.

7. The memory cell of claim 1 wherein the first and second transistors are each vertical transistors.

8. The memory cell of claim 1 wherein the second capacitor electrode is directly against a top of the capacitor insulator.

9. The memory cell of claim 1 wherein the first capacitor electrode is directly above the first source/drain region of the first transistor.

10. The memory cell of claim 1 wherein the second capacitor electrode is directly above the first source/drain region of the second transistor.

11. The memory cell of claim 10 wherein the second capacitor electrode is directly above the first source/drain region of the first transistor.

12. The memory cell of claim 1 wherein the first capacitor electrode is directly electrically coupled to the first source/drain region of the first transistor and the second capacitor electrode is directly electrically coupled to the first source/drain region of the second transistor.

13. The memory cell of claim 1 wherein the first and second transistors are in a common horizontal plane relative one another.

14. The memory cell of claim 1 wherein the second pillar has an upper portion that is of four-sided diamond shape in horizontal cross-section.

15. A memory cell comprising:
first and second transistors laterally spaced relative to one another;
a capacitor above the first and second transistors; the capacitor comprising:
a conductive first capacitor electrode electrically coupled to a first source/drain region of the first transistor;
a conductive second capacitor electrode electrically coupled to a first source/drain region of the second transistor;
a capacitor insulator between the first and second capacitor electrodes; and
the second capacitor electrode comprising:
a first conductive pillar above the first source/drain region of the first transistor;
a second conductive pillar above the first source/drain region of the second transistor; and
conductive material atop, extending between, and directly electrically coupling together the first and second pillars; and
a first digit line electrically coupled to a second source/drain region of the first transistor and a second digit line electrically coupled to a second source/drain region of the second transistor, the first and second digit lines being elongated along a column line direction, the conductive material of the second capacitor electrode being elongated at an angle other than 90° relative to the column line direction.

16. A memory cell comprising:
first and second transistors laterally spaced relative to one another and comprising an access line that is a gate of each of the first and second transistors and extends laterally between the first and second transistors;
a capacitor above the first and second transistors; the capacitor comprising a conductive first capacitor electrode electrically coupled to a first source/drain region of the first transistor, a conductive second capacitor electrode electrically coupled to a first source/drain region of the second transistor, and a capacitor insulator between the first and second capacitor electrodes; and
a second source/drain region of the first transistor being electrically coupled to a first digit line at a first point along the first digit line and a second source/drain region of the second transistor being electrically coupled to a second digit line at a second point along the second digit line, the first and second digit lines being parallel relative one another within the memory cell along a column line direction, a horizontal line through centers of the first and second points being angled at least 30° within the memory cell relative to the column line direction.

17. A two transistor-one capacitor memory cell comprising:
first and second transistors laterally spaced relative to one another; and
a capacitor above the first and second transistors; the capacitor comprising a conductive first capacitor electrode directly above and electrically coupled to a first source/drain region of the first transistor, a conductive second capacitor electrode directly above the first and second transistors and electrically coupled to a first source/drain region of the second transistor, and a capacitor insulator between the first and second capacitor electrodes; the second capacitor electrode comprising a conductive pillar directly above the first source/drain region of the second transistor, the conductive pillar having an upper portion that is of four-sided diamond shape in horizontal cross-section.

18. An array of two transistor-one capacitor memory cells comprising:
columns of digit lines and rows of access lines, the digit lines comprising first alternating digit lines and second alternating digit lines, the second alternating digit lines individually being between immediately adjacent of the first alternating digit lines;
rows of first field effect transistors individually having a lower of their source/drain regions electrically coupled to one of the first alternating digit lines, rows of second field effect transistors individually having a lower of their source/drain regions electrically coupled to one of the second alternating digit lines, channels of the first and second transistors being inter-row staggered, individual of the rows of access lines being laterally adjacent the channels of the first and second transistors; and
individual capacitors above individual pairs of one of the first transistors and one of the second transistors; the capacitors individually comprising a conductive first capacitor electrode electrically coupled to the first transistor of the individual pair, a conductive second capacitor electrode electrically coupled to the second transistor of the individual pair, and a capacitor insulator between the first and second capacitor electrodes.

19. An array of two transistor-one capacitor (2T-1C) memory cells, the array comprising rows of access lines and columns of digit lines, comprising:
individual of the columns comprising either a) one digit line individually electrically coupling to one source/drain region of a first transistor of individual 2T-1C memory cells within the array and interconnecting the first transistors in that column, or b) another digit line individually electrically coupling to one source/drain region of a second transistor of the individual 2T-1C memory cell and interconnecting the second transistors in that column;
individual of the rows comprising an access line above the digit lines, the access line extending adjacent to transistor channels of the first and second transistors and interconnecting the first and second transistors along that row; and
the individual 2T-1C memory cells comprising a capacitor above the first transistor and above the second transistor of the individual 2T-1 C memory cell, the capacitor comprising:
a conductive first capacitor electrode electrically coupled to the first transistor of the individual 2T-1C memory cell;
a conductive second capacitor electrode electrically coupled to the second transistor of the individual 2T-1C memory cell;
a capacitor insulator between the first and second capacitor electrodes; and
the second capacitor electrode comprising:
a first conductive pillar above the one source/drain region of the first transistor;
a second conductive pillar above the one source/drain region of the second transistor; and conductive material atop, extending between, and directly electrically coupling together the first and second pillars; the conductive material being at least one of a) elongated at an angle other than 90° relative to the columns of the digit lines, or b) elongated at an angle relative to the rows of access lines.

20. An array of two transistor-one capacitor (2T-1C) memory cells, the array comprising rows of access lines and columns of digit lines, comprising:

individual of the columns comprising either a) one digit line individually electrically coupling to one source/drain region of a first transistor of individual 2T-1C memory cells within the array and interconnecting the first transistors in that column, or b) another digit line individually electrically coupling to one source/drain region of a second transistor of the individual 2T-1C memory cell and interconnecting the second transistors in that column;

individual of the rows comprising an access line above the digit lines, the access line extending adjacent to transistor channels of the first and second transistors and interconnecting the first and second transistors along that row and having a maximum width that is greater than that of each of the one and other digit lines; and the individual 2T-1C memory cells comprising a capacitor above the first transistor and above the second transistor of the individual 2T-1 C memory cell.

* * * * *